(12) United States Patent
Huang et al.

(10) Patent No.: US 12,740,156 B2
(45) Date of Patent: Sep. 15, 2026

(54) TRANSIENT VOLTAGE SUPPRESSOR STRUCTURE HAVING MULTIPLE DISCHARGING PATHS

(71) Applicant: AMAZING MICROELECTRONIC CORP., New Taipei City (TW)

(72) Inventors: Sung-Chih Huang, Jiaoxi Township (TW); Chih-Ting Yeh, Zhudong Township (TW); Chia-Wei Chang, New Taipei City (TW)

(73) Assignee: AMAZING MICROELECTRONIC CORP., New Taipei City (TW)

( * ) Notice: Subject to any disclaimer, the term of this patent is extended or adjusted under 35 U.S.C. 154(b) by 170 days.

(21) Appl. No.: 18/918,611

(22) Filed: Oct. 17, 2024

(65) Prior Publication Data

US 2026/0114052 A1 Apr. 23, 2026

(51) Int. Cl.
*H10D 89/60* (2025.01)
*H10D 62/10* (2025.01)
(Continued)

(52) U.S. Cl.
CPC ........... *H10D 89/611* (2025.01); *H10D 62/10* (2025.01); *H10D 62/124* (2025.01);
(Continued)

(58) Field of Classification Search
CPC .... H10D 62/10; H10D 62/124; H10D 62/177; H10D 84/617; H10D 84/619; H10D 89/611; H10D 89/713
(Continued)

(56) References Cited

U.S. PATENT DOCUMENTS 8,169,000 B2 * 5/2012 Chuang ................ H10D 89/611 361/91.5
8,304,838 B1 * 11/2012 Chen .................... H10D 89/611 257/370
(Continued)

FOREIGN PATENT DOCUMENTS

CN 109841608 A 6/2019
CN 113658946 A * 11/2021 ............ H10W 10/17
(Continued)

OTHER PUBLICATIONS

Machine translation of Huang et al. Chinese Patent Document CN 116230707 A Jun. 2023 (Year: 2023).*
(Continued)

*Primary Examiner* — Kevin J Comber
(74) *Attorney, Agent, or Firm* — Birch, Stewart, Kolasch & Birch, LLP

(57) ABSTRACT

A transient voltage suppressor is provided, including a semiconductor substrate and a doped well of first conductivity type, an epitaxial layer of second conductivity type, first and second heavily doped regions of second conductivity type, and a third heavily doped region of first conductivity type in the doped well. The first heavily doped region is connected to a fourth heavily doped region of second conductivity type, and the fourth heavily doped region and a fifth heavily doped region of first conductivity type are disposed in the epitaxial layer. A sixth heavily doped region of second conductivity type is disposed in the epitaxial layer and connected in common with the third heavily doped region in the doped well. The fifth and second heavily doped regions are connected to I/O and ground, respectively. When applying a positive surged mode, the disclosed transient voltage suppressor is characterized by providing multiple discharging paths.

31 Claims, 19 Drawing Sheets

(51) Int. Cl.
*H10D 62/17* (2025.01)
*H10D 84/60* (2025.01)

(52) U.S. Cl.
CPC ......... *H10D 62/177* (2025.01); *H10D 84/617* (2025.01); *H10D 84/619* (2025.01); *H10D 89/713* (2025.01)

(58) Field of Classification Search
USPC ............................................................ 361/56
See application file for complete search history.

(56) References Cited

U.S. PATENT DOCUMENTS 10,903,204 B2 1/2021 Chuang et al.
2009/0032838 A1* 2/2009 Tseng .................. H10D 89/713 257/133
2009/0045457 A1* 2/2009 Bobde .................... H10D 8/411 257/E29.066
2012/0241903 A1* 9/2012 Shen ........................ H10D 8/20 257/E29.166
2017/0069620 A1* 3/2017 Tu ........................ H10D 89/611
2022/0399717 A1 12/2022 Chen

FOREIGN PATENT DOCUMENTS

CN 116230707 A * 6/2023 ............... H10D 8/80
TW 201240063 A1 10/2012
TW I763442 B 5/2022

OTHER PUBLICATIONS

Machine translation of Yang et al. Chinese Patent Document CN 113658946 A Nov. 2021 (Year: 2021).*

* cited by examiner

TRANSIENT VOLTAGE SUPPRESSOR STRUCTURE HAVING MULTIPLE DISCHARGING PATHS

BACKGROUND OF THE INVENTION

Field of the Invention

The present disclosure is related to a transient voltage suppressor design scheme. And more particularly, the present invention is related to a transient voltage suppressor structure which is characterized by electrically connecting a base region of a bipolar junction transistor therein with its epitaxial layer so as to generate a plurality of conducting paths when a transient event takes place, thereby increasing the electrostatic discharge efficiency of the disclosed transient voltage suppressor circuit.

Description of the Prior Art

As known, a transient voltage suppressor or known as a "VS" is a general classification of electronic components that are designed to react to sudden or momentary overvoltage conditions. One such common device used for this purpose is known as the transient voltage suppression diode, a Zener diode designed to protect electronics device against over-voltages. In general, the characteristic of a transient voltage suppressor (TVS) requires that it responds to overvoltages faster than other common overvoltage protection components such as varistors or gas discharge tubes. Such characteristic of the TVS device or component makes it much more useful for protection against extremely fast and often damaging voltage spikes, since these fast overvoltage spikes are present on all distribution networks and can be caused by either internal or external events, such as lightning or motor arcing. In addition, applications of the transient voltage suppression devices are able to be used for unidirectional or bidirectional electrostatic discharge (ESD) protection of transmission or data lines in electronic circuits. Usually, the level of the ESD energy in a transient overvoltage can be equated to energy measured in joules or related to electric current when devices are rated for various applications. These bursts of overvoltage can be measured with specialized electronic meters that can show power disturbances of thousands of volts amplitude that last for a few microseconds or less.

An U.S. patent number of U.S. Pat. No. 8,169,000 B2 has disclosed a lateral transient voltage suppressor with ultra low capacitance, wherein the disclosed suppressor comprises a first conductivity type substrate and at least one diode cascade structure arranged in the first conductivity type substrate. The cascade structure further comprises at least one second conductivity type lightly doped well and at least one first conductivity type lightly doped well, wherein there are two heavily doped areas arranged in the second conductivity type lightly doped well and the first conductivity type lightly doped well. The cascade structure neighbors a second conductivity type well, wherein there are three heavily doped areas arranged in the second conductivity type well. The suppressor further comprises a plurality of deep isolation trenches arranged in the first conductivity type substrate and having a depth greater than depths of the second conductivity type lightly doped well, the second conductivity type well and the first conductivity type lightly doped well. Each doped well is isolated by trenches. In such a lateral transient voltage suppressor of U.S. Pat. No. 8,169,000 B2, a low-capacitance steering diode is employed at its input and output (I/O) terminal, while a uni-directional N-type bipolar junction transistor (N-type BJT) is generated and performs as a power clamp structure.

On the other hand, another U.S. patent number of U.S. Pat. No. 10,903,204 B2 has disclosed a lateral transient voltage suppressor device, which comprises a doped substrate, a lateral clamping structure disposed on the doped substrate, a buried doped layer disposed between the doped substrate and the lateral clamping structure for isolation, at least one diode module, and at least one trench arranged in the doped substrate, having a depth not less than that of the buried doped layer, and being disposed between the lateral clamping structure and the at least one diode module for electrical isolation. The doped substrate and the buried doped layer have opposite conductivity types such that the doped substrate is electrically floating. The buried doped layer can be further disposed to separate the diode module from the doped substrate. The disclosed lateral transient voltage suppressor device is generally known for maintaining lower clamping voltage as well as reduced dynamic resistance. In such a lateral transient voltage suppressor device of U.S. Pat. No. 10,903,204 B2, a low-capacitance steering diode may be also employed at its input and output (I/O) terminal, however, a bi-directional N-type bipolar junction transistor (N-type BJT) is generated instead, so as to be provided as its power clamping structure.

Regarding the above mentioned prior patents in the related arts, please refer to FIG. 1, which generally shows a schematic structural diagram of a conventional layout in the current technologies for preventing the potential silicon controlled rectifier (SCR) path generated in the transient voltage suppressor device. As can be seen in FIG. 1, the P-type heavily doped region (P+) 111 and the N-type heavily doped region (N+) 113 forms a P/N steering diode, while the N-type heavily doped region (N+) 211, a P-type well region (P-well) 213 and an N-type heavily doped region (N+) 215 forms an N/P/N bipolar junction transistor (BJT) structure. In order to effectively suppress and prevent the potential silicon controlled rectifier (SCR) latch-up path as illustrated by the arrow 311 in the drawing of FIG. 1, a distance S needs to be provided between the P/N steering diode and the N/P/N bipolar junction transistor structure, and the distance S must be designed long enough for making the P/N steering diode and the N/P/N bipolar junction transistor structure apart from each other. Nevertheless, it draws our attention that, by employing such a design method, layout area consumption will be greatly increased, and in addition, the bipolar junction transistor structure is more likely to have a much reduced gain due to its base region being picked up.

In order to address the issues, a modified design manner has been provided as being illustrated in FIG. 2. Please refer to FIG. 2, which schematically shows a modified structural diagram in the current technologies for solving the redundant layout area waste in view of FIG. 1 in the prior arts. As can be seen in FIG. 2, an N-type epitaxial layer (shown as an N-type epi layer) 200 and a plurality of deep trench 202 are adopted for the purposes of saving the layout area and suppressing the silicon controlled rectifier (SCR) latch-up path at the same time. It can be expected that, then the base region of the N/P/N bipolar junction transistor structure can be floating in order to have a higher gain. In such a layout diagram in FIG. 2, the N-type buried layer (shown as NBL) 300 can be alternatively optional. Although several design manners have been discussed these days in the current technology and yet, challenges are still remained, and further modifications are still believed to be expected.

As a result, based on the foregoing drawbacks and necessary suppression and elimination of the conventional issues are thus to be expected, it, in view of all, should be apparent and obvious that there is indeed an urgent need for the professionals in the field for a novel and inventive transient voltage suppressor device structure to be developed, so as to solve the above-mentioned issues occurring in the prior arts. And in particular, the full detailed specific descriptions and implementations are now to be provided by Applicants of the present invention in the following paragraphs as below for your references.

SUMMARY OF THE INVENTION

In order to overcome the above-mentioned disadvantages, one major objective in accordance with the present invention is provided for a novel and creative circuit scheme for providing a transient voltage suppressor structure. And more particularly, the proposed circuit scheme of the disclosed transient voltage suppressor structure is characterized by having multiple discharging paths, in view of the advantageous of using less circuit complexity and circuit layout area consumption.

Another objective in accordance with the present invention is to provide a novel and inventive transient voltage suppressor structure having multiple discharging paths, in which a base region of a bipolar junction transistor therein with its epitaxial layer are electrically coupled in common, so as to generate a plurality of conducting and discharging paths when a transient event takes place. As a result, while compared to the prior arts, a plurality of discharging paths can be further generated, so as to release the transient surge, and also to lower the conducting resistivity for the purpose of providing an even better Electro Static Discharge (ESD) performance.

And yet, one more another objective in accordance with the present invention is to provide an inventive and new transient voltage suppressor structure having multiple discharging paths, in which when a positive surged operating mode is applied to the disclosed transient voltage suppressor structure, the multiple discharging paths to be formed, include not only a first lateral diode conducting path, a lateral n-p-n bipolar junction transistor conducting path, but also a vertical p-n-p bipolar junction transistor conducting path, a vertical diode conducting path and a second lateral diode conducting path. Moreover, a vertically-grounding conducting path, and/or a vertical pick-up conducting path may be alternatively generated based on a plurality of variant embodiments of the present invention. By employing the plurality of feasible circuit design figures, the layout circuit fabrication process of the present invention is advantageous of having extraordinary flexibility. As a result, it is apparent that the process complexity of the present invention is able to be made lowered and easy to be in control.

Therefore, in the following descriptions, the Applicants will proceed to provide a plurality of embodiments and variations that will be discussed later in the following paragraphs in order to verify the proposed transient voltage suppressor structure having multiple discharging paths is effective. Thereby, it is worthy of full attentions that the present invention achieves to successfully solve the problems of prior arts and meanwhile maintain superior electrical properties. As a result, it is believed that the proposed technical contents of the present invention are extremely advantageous of as being highly competitive and able to be widely utilized in related IC and semiconductor industries.

Therefore, in order to achieve the above-mentioned objectives, the present invention is aimed to provide a modified and improved transient voltage suppressor structure having multiple discharging paths, and the proposed transient voltage suppressor structure having multiple discharging paths will now be introduced as in the following descriptions.

According to the present invention, the disclosed transient voltage suppressor structure having multiple discharging paths includes a semiconductor substrate of a first conductivity type, an epitaxial layer of a second conductivity type, which is formed on the semiconductor substrate of the first conductivity type, wherein the second conductivity type is opposite to the first conductivity type, and a doped well region of the first conductivity type, which is formed in the epitaxial layer of the second conductivity type.

A first heavily doped region of the second conductivity type, a second heavily doped region of the second conductivity type, and a third heavily doped region of the first conductivity type are further disposed in the doped well region of the first conductivity type. The second heavily doped region of the second conductivity type is electrically connected to a first pin, the first heavily doped region of the second conductivity type is electrically connected to a fourth heavily doped region of the second conductivity type, and the fourth heavily doped region of the second conductivity type and a fifth heavily doped region of the first conductivity type are commonly disposed in the epitaxial layer of the second conductivity type. The fifth heavily doped region of the first conductivity type is electrically connected to a second pin.

In addition, a sixth heavily doped region of the second conductivity type is further disposed in the epitaxial layer of the second conductivity type and the sixth heavily doped region of the second conductivity type in the epitaxial layer of the second conductivity type is electrically connected in common with the third heavily doped region of the first conductivity type in the doped well region of the first conductivity type.

A plurality of isolation trenches are configured and disposed adjacent to the fifth heavily doped region of the first conductivity type, adjacent to the sixth heavily doped region of the second conductivity type and between the first heavily doped region of the second conductivity type and the fourth heavily doped region of the second conductivity type for electrical isolations, wherein a depth of each of the plurality of isolation trench is greater than a depth of the epitaxial layer of the second conductivity type.

According to one preferred embodiment of the present invention, when the first conductivity type is a P-type conductivity type and the second conductivity type is an N-type conductivity type, the above-mentioned first pin and the second pin are electrically coupled to a ground terminal and to an input and output (I/O) terminal, respectively, in order to generated and provide a positive surged operating mode.

In such an embodiment of the present invention, when the positive surged operating mode is applied, the transient voltage suppressor structure having multiple discharging paths is formed, and the plurality of discharging paths which are formed comprises at least a first lateral diode conducting path, a lateral n-p-n bipolar junction transistor conducting path, a vertical p-n-p bipolar junction transistor conducting path, a vertical diode conducting path and a second lateral diode conducting path.

According to the embodiment of the present invention, the first lateral diode conducting path is constructed from the input and output (I/O) terminal, the fifth heavily doped region of the first conductivity type, the epitaxial layer of the second conductivity type to the fourth heavily doped region of the second conductivity type.

The lateral n-p-n bipolar junction transistor conducting path is constructed from the first heavily doped region of the second conductivity type, the doped well region of the first conductivity type, the second heavily doped region of the second conductivity type to the ground terminal.

The vertical p-n-p bipolar junction transistor conducting path is constructed from the input and output (I/O) terminal, the fifth heavily doped region of the first conductivity type, the epitaxial layer of the second conductivity type to the semiconductor substrate of the first conductivity type.

The vertical diode conducting path is constructed from the semiconductor substrate of the first conductivity type, the epitaxial layer of the second conductivity type to the sixth heavily doped region of the second conductivity type. And furthermore, the second lateral diode conducting path is constructed from the third heavily doped region of the first conductivity type, the doped well region of the first conductivity type, the second heavily doped region of the second conductivity type to the ground terminal.

In practical, during a normal operation of the disclosed transient voltage suppressor structure, even though a plurality of discharging paths are formed when a transient event is generated, there should be no leakage path generated therein the transient voltage suppressor device. As a result, when a power supply voltage, for instance, a VDD is injected to the input and output (I/O) terminal, it is believed that a voltage level of the power supply voltage should be less than a first turn-on voltage for turning on the first lateral diode conducting path and the lateral n-p-n bipolar junction transistor conducting path. And, in addition, a voltage level of the power supply voltage VDD should be also less than a second turn-on voltage for turning on the vertical p-n-p bipolar junction transistor conducting path, the vertical diode conducting path and the second lateral diode conducting path in order to effectively suppress and avoid the unexpected leakage currents to be generated in the disclosed transient voltage suppressor structure of the present invention.

In another aspect, according to one another alternative embodiment of the present invention, it may be applicable that, the semiconductor substrate of the first conductivity type can be further electrically connected to the ground terminal for additionally providing a vertically-grounding conducting path. Under such a circuit configuration, in specific, then the formed vertically-grounding conducting path is constructed from the input and output (I/O) terminal, the fifth heavily doped region of the first conductivity type, the epitaxial layer of the second conductivity type, the semiconductor substrate of the first conductivity type and to the ground terminal.

And yet, furthermore, according to one another alternative embodiment of the present invention, then the disclosed transient voltage suppressor structure may further include a buried layer of the second conductivity type and a deep doped well region of the second conductivity type, wherein the buried layer of the second conductivity type is disposed between the semiconductor substrate of the first conductivity type and the epitaxial layer of the second conductivity type, and the deep doped well region of the second conductivity type is disposed in the epitaxial layer of the second conductivity type for accommodating the sixth heavily doped region of the second conductivity type. In addition, the deep doped well region of the second conductivity type is isolated from the doped well region of the first conductivity type and the deep doped well region of the second conductivity type is in connection with the buried layer of the second conductivity type. In such a variant configuration of the embodiment, a depth of the deep doped well region of the second conductivity type should be at least greater than a depth of the doped well region of the first conductivity type in order to effectively contact with the buried layer of the second conductivity type.

In addition, a doped concentration of the buried layer of the second conductivity type should be at least greater than a doped concentration of the epitaxial layer of the second conductivity type in order to further reduce an on-resistance of the disclosed transient voltage suppressor structure having multiple discharging paths.

And furthermore, according to one yet another alternative embodiment of the present invention, then the disclosed transient voltage suppressor structure may further include a second doped well region of the first conductivity type and a seventh heavily doped region of the first conductivity type, wherein the second doped well region of the first conductivity type is disposed in the epitaxial layer of the second conductivity type for accommodating the seventh heavily doped region of the first conductivity type.

According to such an embodiment, the second doped well region of the first conductivity type and the seventh heavily doped region of the first conductivity type are disposed apart from the sixth heavily doped region of the second conductivity type by the isolation trench, and the seventh heavily doped region of the first conductivity type can be electrically coupled with the third heavily doped region of the first conductivity type and the sixth heavily doped region of the second conductivity type in common.

At this time, when a positive surged operating mode is applied, and the transient voltage suppressor structure having multiple discharging paths is formed, then the multiple discharging paths to be formed include the first lateral diode conducting path, the lateral n-p-n bipolar junction transistor conducting path, the vertical p-n-p bipolar junction transistor conducting path, the vertical diode conducting path, and the second lateral diode conducting path as disclosed earlier, and what draws our attention is that, an additionally generated vertical pick-up conducting path can be formed.

According to such an embodiment, the vertical pick-up conducting path is constructed from the semiconductor substrate of the first conductivity type, the second doped well region of the first conductivity type to the seventh heavily doped region of the first conductivity type. And after that, the vertical pick-up conducting path can be successively coupled with the sixth heavily doped region of the second conductivity type and the third heavily doped region of the first conductivity type, and further in electrical connection with the second lateral diode conducting path and finally to the ground terminal. As a result, it is believed that when the positive surged operating mode is applied thereto the disclosed embodiment of the present invention, then another transient voltage suppressor structure having multiple discharging paths is effectively formed as well.

And still according to one more another alternative embodiment of the present invention, then the disclosed transient voltage suppressor structure may further include a second doped well region of the first conductivity type and a seventh heavily doped region of the first conductivity type, wherein the second doped well region of the first conductivity type is disposed in the epitaxial layer of the second conductivity type for accommodating the seventh heavily doped region of the first conductivity type.

According to such an embodiment, then the second doped well region of the first conductivity type and the seventh heavily doped region of the first conductivity type are disposed apart from the sixth heavily doped region of the second conductivity type by the isolation trench, and the seventh heavily doped region of the first conductivity type can be alternatively be in electrical connection with the second heavily doped region of the second conductivity type and the first pin, which is the ground terminal, in common. Under such a circumstance, then the vertical pick-up conducting path to be formed herein, is different from the previous embodiment, and is constructed from the semiconductor substrate of the first conductivity type, the second doped well region of the first conductivity type, the seventh heavily doped region of the first conductivity type and directly to the ground terminal. By employing such configurations of the circuit diagram, it is believed that one another transient voltage suppressor structure having multiple discharging paths can be effectively formed as well.

To sum up, it is worthy of emphasizing that, the plurality of various disclosed configurations of the present invention are compatible with each other. In other words, people who are skilled in the art and having ordinary understandings and technical backgrounds to the present invention, are able to make various modifications or layout distributions depending on different circuit regulations and/or specifications without departing from the scope of the invention. That is to say, the present invention is certainly not limited thereto the disclosed embodiments. And the modified embodiments and/or circuit implementations if there is any, should still fall into the claim scope of the present invention.

And still furthermore, according to the variant embodiment of the present invention, then the above mentioned first conductivity type and the second conductivity type are certainly not limited to the foregoing disclosed embodiments as a P-type conductivity type and an N-type conductivity type, respectively. In the variant embodiment of the present invention, the first conductivity type may alternatively be an N-type conductivity type, while the second conductivity type will be a P-type conductivity type. The present invention is not limited by the conductivity type configurations of the transient voltage suppressor structure circuit diagram thereto.

As a result, to sum up, it should be noted that according to the foregoing disclosed technical contents provided by the Applicant, the present invention is certainly not limited thereto by the above-mentioned embodiments. In other words, for people who are skilled in the art and having ordinary understandings and technical backgrounds to the present invention, it would be allowed for them to make various modifications or changes depending on different circuit regulations and/or specifications without departing from the scope of the invention. That is to say, the present invention is certainly not limited thereto. And the variant embodiments and/or circuit implementations should still fall into the claim scope of the present invention.

In general, those skilled in the art and having general knowledge are able to make appropriate modifications or variations with respective to the technical contents disclosed in the present invention without departing from the spirits of the present invention. The present invention is not restricted by the certain limited configurations and/or circuit diagrams disclosed in the embodiments of the present invention. As such, it is believed that the modifications or variations should still fall into the scope of the present invention, and the present invention covers the modifications and its equality.

As a result, based on the disclosed technical features illustrated as above, it is evident that the present invention is sophisticatedly designed and indeed discloses a novel modified scheme for a new transient voltage suppressor structure to be developed having a plurality of multiple conducting paths to be formed. By adopting the present invention, it is believed that the present invention achieves in effectively eliminating the conventional drawback issues occurring in the prior arts. In addition, since the plurality of multiple discharging paths can be formed effectively by the present invention, it is apparent that, the electrostatic discharge (ESD) efficiency of the disclosed transient voltage suppressor circuit is greatly improved. And therefore, as a result, it is believed that the proposed transient voltage suppressor structure having multiple discharging paths as disclosed by the present invention, is beneficial in view of a great number of merits. Thus, it is believed that the present invention is extremely advantageous while compared to the prior arts.

These and other objectives of the present invention will become obvious to those of ordinary skill in the art after reading the following detailed description of preferred embodiments. And it is to be understood that both the foregoing general description and the following detailed description are exemplary and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
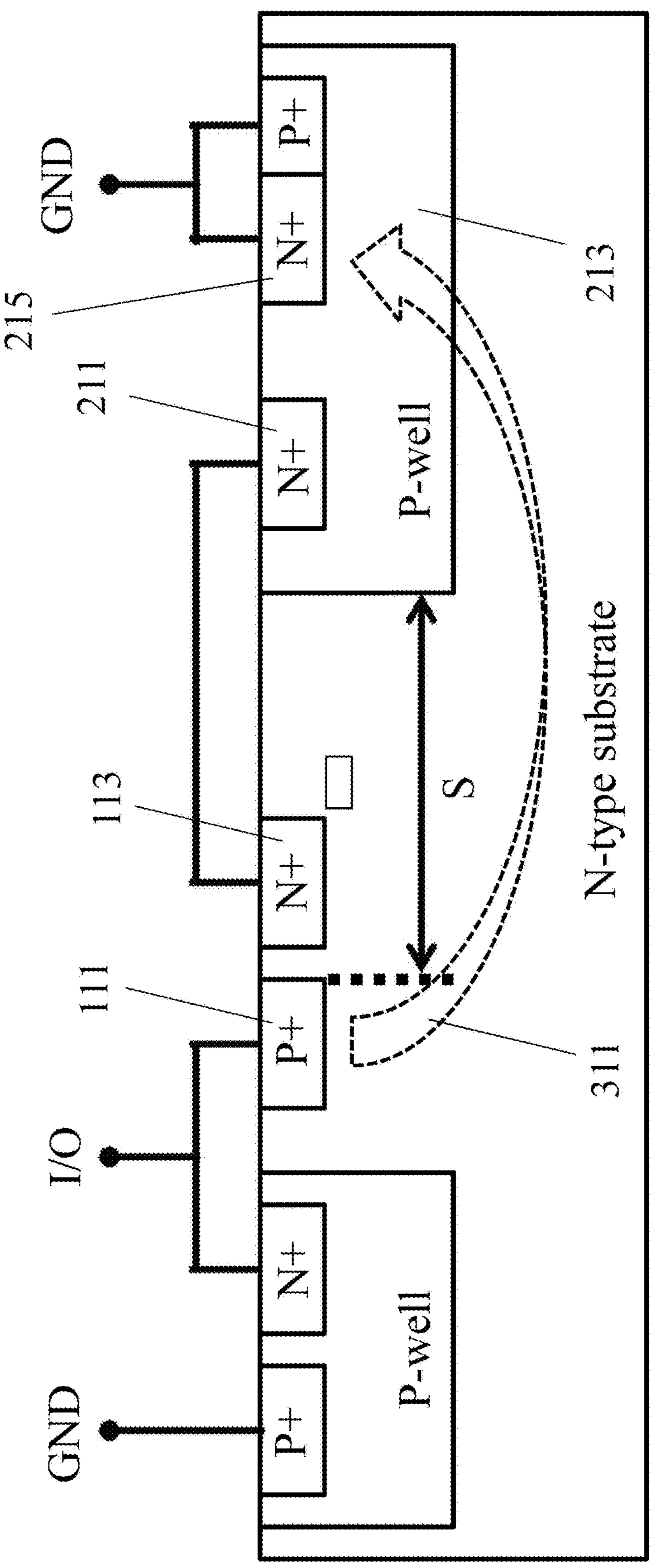
FIG. 1 generally shows a schematic structural diagram of a conventional layout in the current technologies for preventing the potential silicon controlled rectifier (SCR) path generated in the transient voltage suppressor device in the prior arts.
Figure 2:
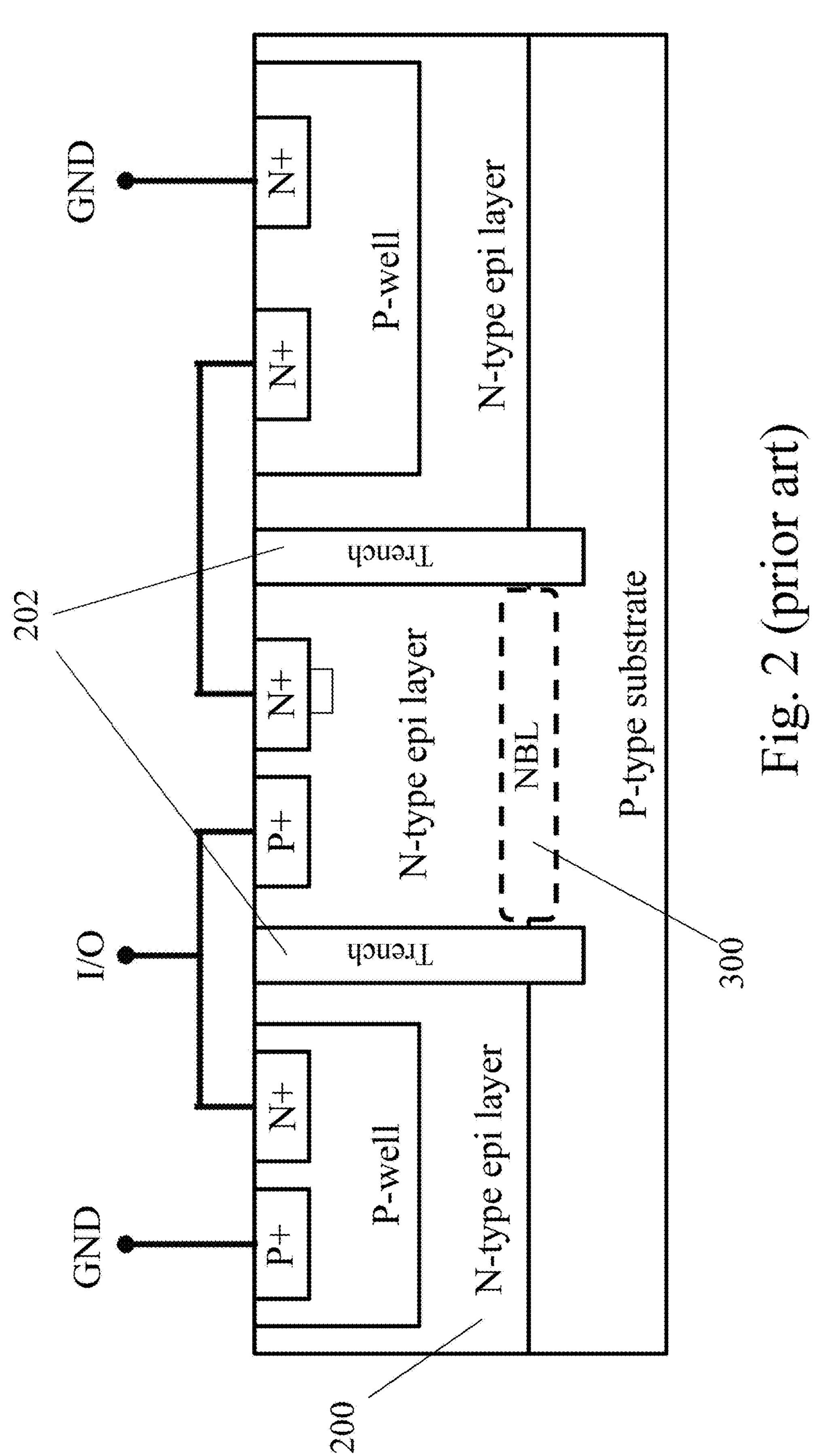
FIG. 2 schematically shows a modified structural diagram in the current technologies for solving the redundant layout area waste in view of FIG. 1 in the prior arts.

Reference will now be made in detail to the preferred embodiments of the present invention, examples of which are illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

The embodiments described below are illustrated to demonstrate the technical contents and characteristics of the present invention and to enable the persons skilled in the art to understand, make, and use the present invention. However, it shall be noticed that it is not intended to limit the scope of the present invention. Therefore, any equivalent modification or variation according to the spirit of the present invention is to be also included within the scope of the present invention.

Unless otherwise specified, some conditional sentences or words, such as "can", "could", "might", or "may", usually attempt to express that the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

The terms "substantially," "around," "about" and "approximately" can refer to within 20% of a given value or range, and preferably within 10%. Besides, the quantities provided herein can be approximate ones and can be described with the aforementioned terms if are without being specified. When a quantity, density, or other parameters includes a specified range, preferable range or listed ideal values, their values can be viewed as any number within the given range.

As the Applicants have described earlier in the Description of the Prior Art, since the conventional transient voltage suppressor (TVS) devices are mostly in lack of circuit design flexibility and also known as consuming a great amount of circuit design layout area, which lead to unfavorable mass production, the present invention is thus provided and aimed to solve such drawbacks by proposing a novel and inventive transient voltage suppressor structure. The Applicants of the Application, as a result, propose a novel and modified transient voltage suppressor structure which is characterized by generating a plurality of conducting paths when a transient event takes place so as to form multiple discharging paths, as disclosed in the present invention. By employing such modification and improvements, the provided transient voltage suppressor having multiple discharging paths is advantageous of showing extraordinary electrostatic discharge efficiency, while compared with the prior arts. In the following paragraphs, the disclosed transient voltage suppressor having multiple discharging paths will now be provided and illustrated by a plurality of variant embodiments as described in the following sections for your references.

Figure 3:
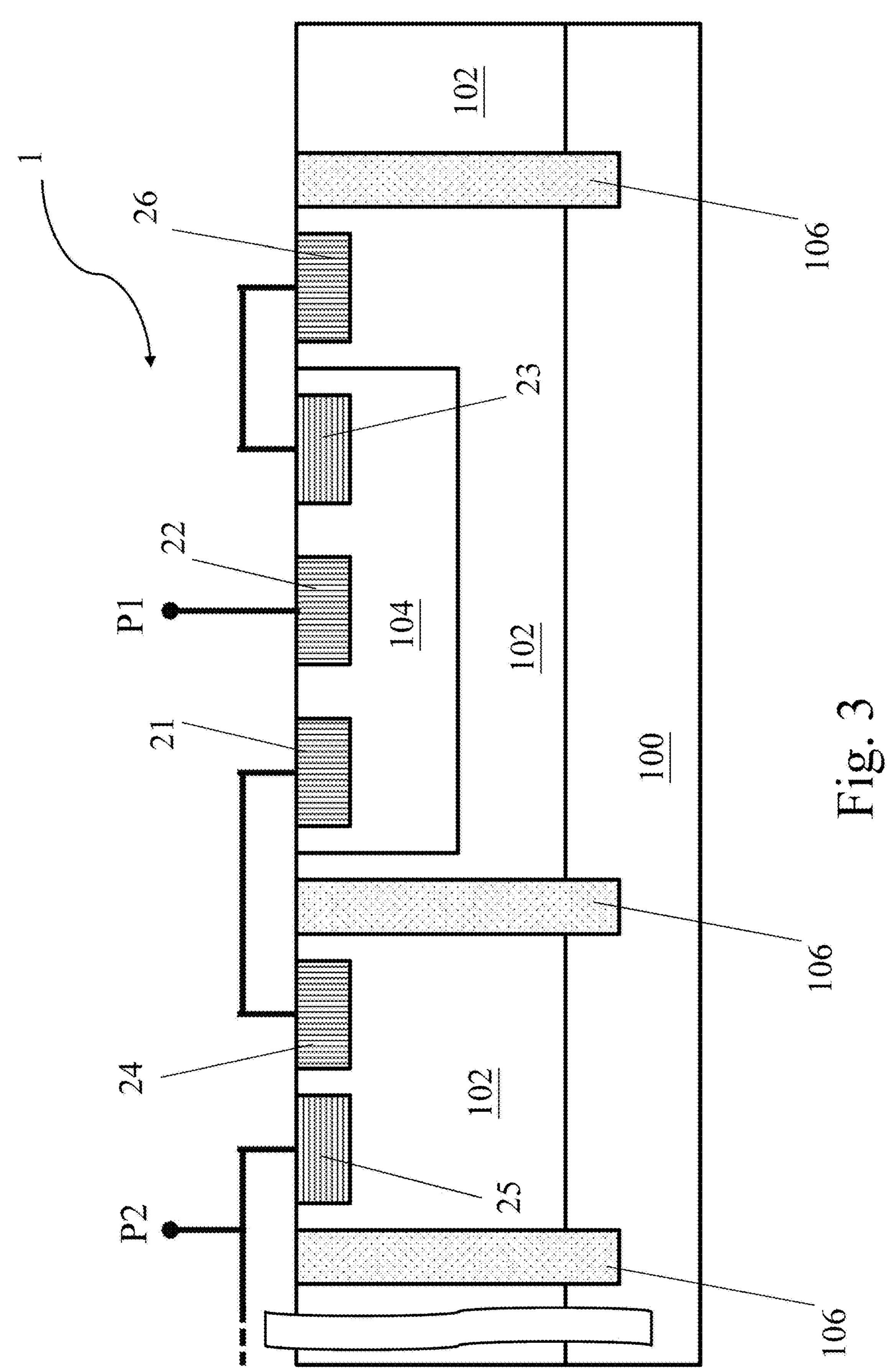
FIG. 3 schematically shows a layout structural diagram of a proposed transient voltage suppressor structure having multiple discharging paths in accordance with a main embodiment of the present invention.

At first, please refer to FIG. 3, which schematically shows a layout structural diagram of a proposed transient voltage suppressor structure having multiple discharging paths in accordance with a main embodiment of the present invention. According to the present invention, the proposed transient voltage suppressor structure having multiple discharging paths 1 includes a semiconductor substrate 100, an epitaxial layer 102, a doped well region 104, a first heavily doped region 21, a second heavily doped region 22, a third heavily doped region 23, a fourth heavily doped region 24, a fifth heavily doped region 25, and a sixth heavily doped region 26. According to the main embodiment of the present invention, the semiconductor substrate 100 has a first conductivity type. And, the epitaxial layer 102, on the contrary, has a second conductivity type, and the epitaxial layer 102 of the second conductivity type is formed on the semiconductor substrate 100 of the first conductivity type. According to the embodiment of the present invention, the first conductivity type and the second conductivity type are relatively different conductivity types, and the second conductivity type is opposite to the first conductivity type. The doped well region 104 has a first conductivity type, which is the same as the first conductivity type of the semiconductor substrate 100. And, the doped well region 104 of the first conductivity type is formed in the epitaxial layer 102 of the second conductivity type.

According to the embodiment of the present invention, the first heavily doped region 21 has the second conductivity type, the second heavily doped region 22 has the second conductivity type, the third heavily doped region 23 has the first conductivity type, the fourth heavily doped region 24 has the second conductivity type, the fifth heavily doped region 25 has the first conductivity type, and the sixth heavily doped region 26 has the second conductivity type. As can be seen in FIG. 3, the first heavily doped region 21 of the second conductivity type, the second heavily doped region 22 of the second conductivity type, and the third heavily doped region 23 of the first conductivity type are disposed in the doped well region 104 of the first conductivity type. In addition, the second heavily doped region 22 of the second conductivity type is electrically connected to a first pin P1. And, the fourth heavily doped region 24 of the second conductivity type and the fifth heavily doped region 25 of the first conductivity type are commonly disposed in the epitaxial layer 102 of the second conductivity type. As can be seen in the proposed transient voltage suppressor structure having multiple discharging paths 1 illustrated in FIG. 3, a plurality of isolation trench 106 are further disposed therein for electrical isolations. For instance, an isolation trench 106 is disposed between the first heavily doped region 21 of the second conductivity type and the fourth heavily doped region 24 of the second conductivity type. An isolation trench 106 is further disposed adjacent to the fifth heavily doped region 25 of the first conductivity type, and an isolation trench 106 is further disposed adjacent to the sixth heavily doped region 26 of the second conductivity type.

According to a preferable embodiment of the present invention, a depth of each of the plurality of isolation trench 106 is greater than a depth of the epitaxial layer 102 of the second conductivity type. As a result, it is evident that each of the plurality of isolation trench 106 is extending into a portion of the semiconductor substrate 100 of the first conductivity type.

Moreover, in addition to the trench 106 disposed between the first heavily doped region 21 of the second conductivity type and the fourth heavily doped region 24 of the second conductivity type, the first heavily doped region 21 of the second conductivity type and the fourth heavily doped region 24 of the second conductivity type are electrically connected in common by a wiring, for instance, such that the first heavily doped region 21 of the second conductivity type and the fourth heavily doped region 24 of the second conductivity type have the same voltage level. On the other hand, the fifth heavily doped region 25 of the first conductivity type disposed in the epitaxial layer 102 of the second conductivity type is, on the contrary, electrically connected to a second pin P2.

In another aspect, while regarding a sixth heavily doped region 26 of the second conductivity type, it can be seen that the sixth heavily doped region 26 of the second conductivity type is being configured and disposed in the epitaxial layer 102 of the second conductivity type and the sixth heavily doped region 26 of the second conductivity type in the epitaxial layer 102 of the second conductivity type is electrically connected in common with the third heavily doped region 23 of the first conductivity type which is disposed in the doped well region 104 of the first conductivity type.

In view of the main embodiment as illustrated in the FIG. 3 scheme, as referring to the technical contents, it is illustrative that when the disclosed first conductivity type is a P-type conductivity type, the second conductivity type will be an N-type conductivity type. Under such a conductivity type configuration, please refer to FIG. 4, which shows an illustrative embodiment of the transient voltage suppressor structure having multiple discharging paths 4, according to FIG. 3 when the first conductivity type and the second conductivity type is a P-type conductivity type and an N-type conductivity type, respectively. Under such a circumstance, as can be seen in the FIG. 4 embodiment, the semiconductor substrate 100 of the first conductivity type is a P-type substrate and is illustrated as a "P-type sub". On the other hand, when the second conductivity type is an N-type conductivity type, then the epitaxial layer 102 of the second conductivity type, which is formed on the semiconductor substrate 100 of the first conductivity type is an N-type epitaxial layer and is illustrated as an "N-type epi layer".

In addition, the doped well region 104 of the first conductivity type, which is formed in the epitaxial layer 102 of the second conductivity type, is a P-type doped well region and is illustrated as a "P-type well". Regarding the first to sixth heavily doped regions of various conductivity types, the first heavily doped region 21 of the second conductivity type is an N-type heavily doped region and is illustrated as an "N+" in FIG. 4. Similarly, the second heavily doped region 22 of the second conductivity type is also an N-type heavily doped region and is illustrated as an "N+" as well. The third heavily doped region 23 of the first conductivity type, on the other hand, is a P-type heavily doped region and is illustrated as a "P+" in FIG. 4. The fourth heavily doped region 24 of the second conductivity type is an N-type heavily doped region and is illustrated as an "N+", the fifth heavily doped region 25 of the first conductivity type, on the other hand, is a P-type heavily doped region and is illustrated as a "P+", and the sixth heavily doped region 26 of the second conductivity type is an N-type heavily doped region and is illustrated as an "N+" in FIG. 4.

Nevertheless, according to the technical contents of the present invention, the present invention is certainly not limited thereto such conductivity type configurations. According to alternative embodiments of the present invention, it is also applicable that the first conductivity type may also be illustrative as an N-type conductivity type, and the second conductivity type may be illustrative as a P-type conductivity type as well, and the alternative variations and embodiments may also be made by people who are skilled in the art and having ordinary skills of the art. And yet, the present invention still covers the modifications and its equality based on the disclosed technical contents of the present invention.

Figure 4:
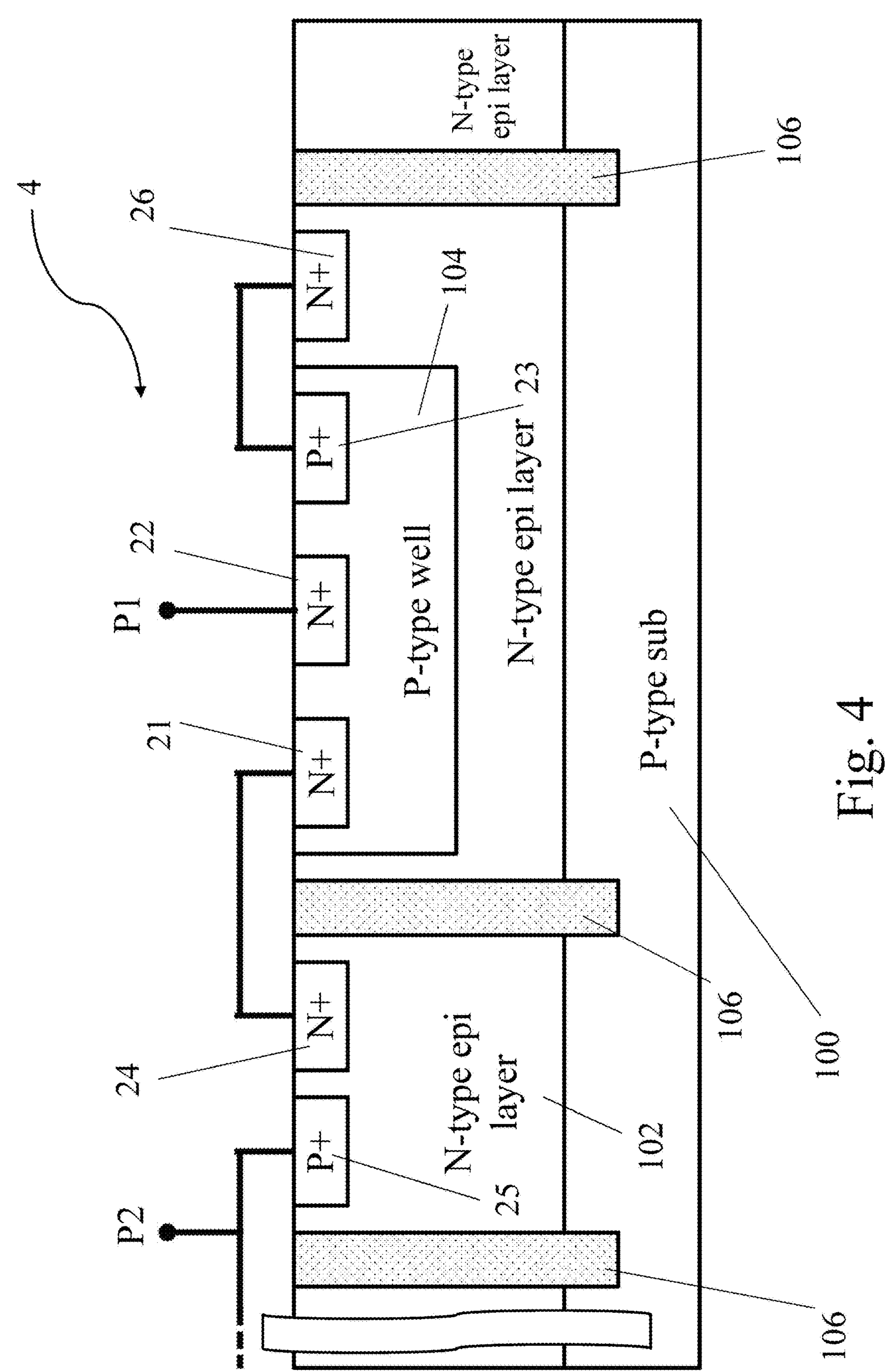
FIG. 4 schematically shows an illustrative embodiment of the disclosed transient voltage suppressor structure having multiple discharging paths according to FIG. 3 when the first conductivity type and the second conductivity type is a P-type conductivity type and an N-type conductivity type, respectively.
Figure 5:
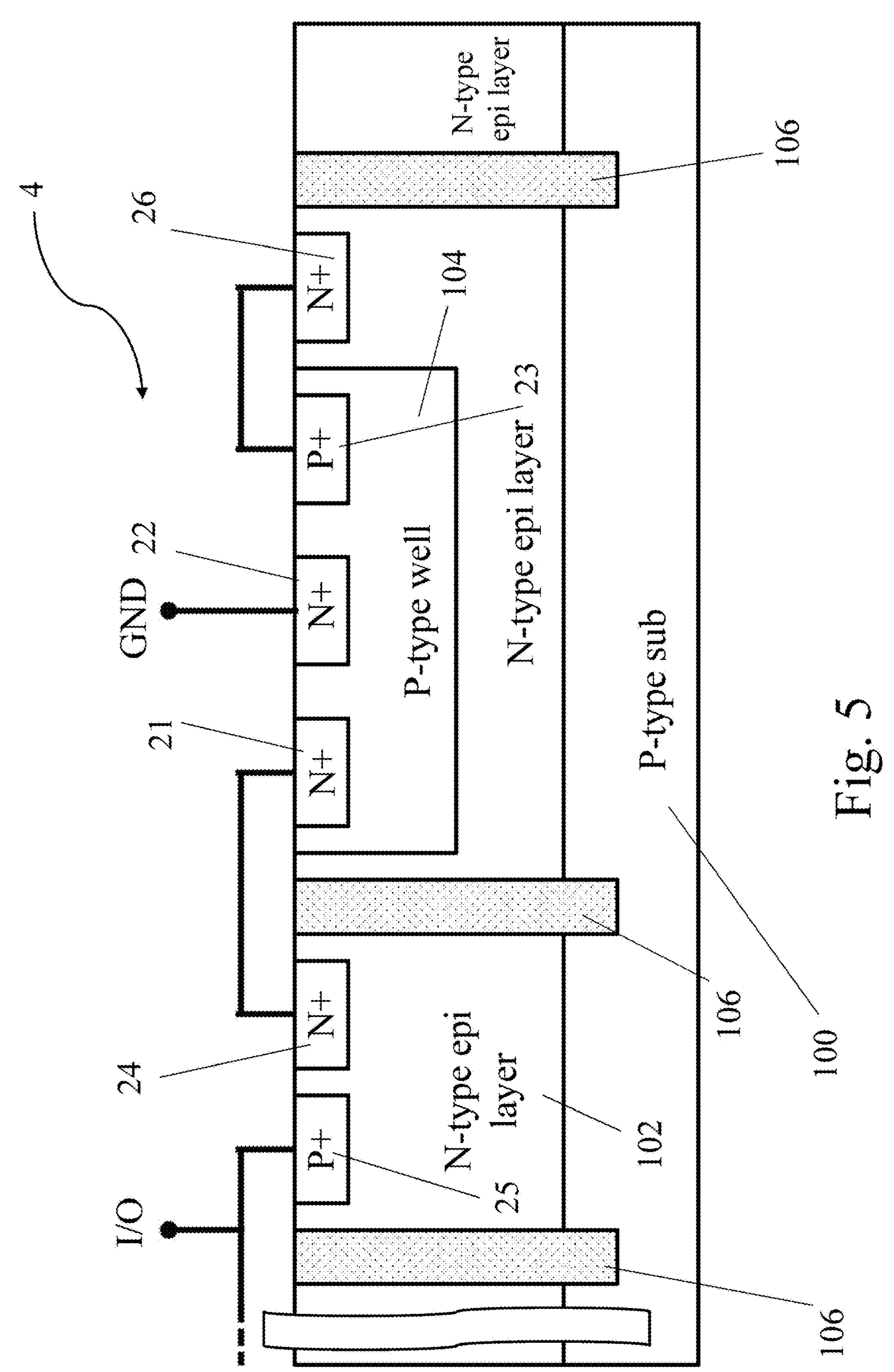
FIG. 5 schematically shows an illustrative embodiment of the disclosed transient voltage suppressor structure having multiple discharging paths according to FIG. 4 when a positive surged operating mode is applied.

Therefore, according to the FIG. 4 embodiment, when the first conductivity type is a P-type conductivity type and the second conductivity type is an N-type conductivity type, then the first pin P1 and the second pin P2 of the disclosed transient voltage suppressor structure having multiple discharging paths 4 are electrically coupled to a ground terminal GND and to an input and output (I/O) terminal I/O, respectively so as to provide a positive surged operating mode as shown in FIG. 5. And, when the positive surged operating mode is applied, it is evident that the disclosed transient voltage suppressor structure 4 is able to form a plurality of multiple discharging paths. Please refer to FIG. 6 for the detailed further descriptions, in which FIG. 6 schematically shows a drawing of the disclosed transient voltage suppressor structure 4 in view of FIG. 5, when the positive surged operating mode is applied, and the multiple discharging paths are formed, where each discharging path is illustrated by arrows in the figure.

Figure 6:
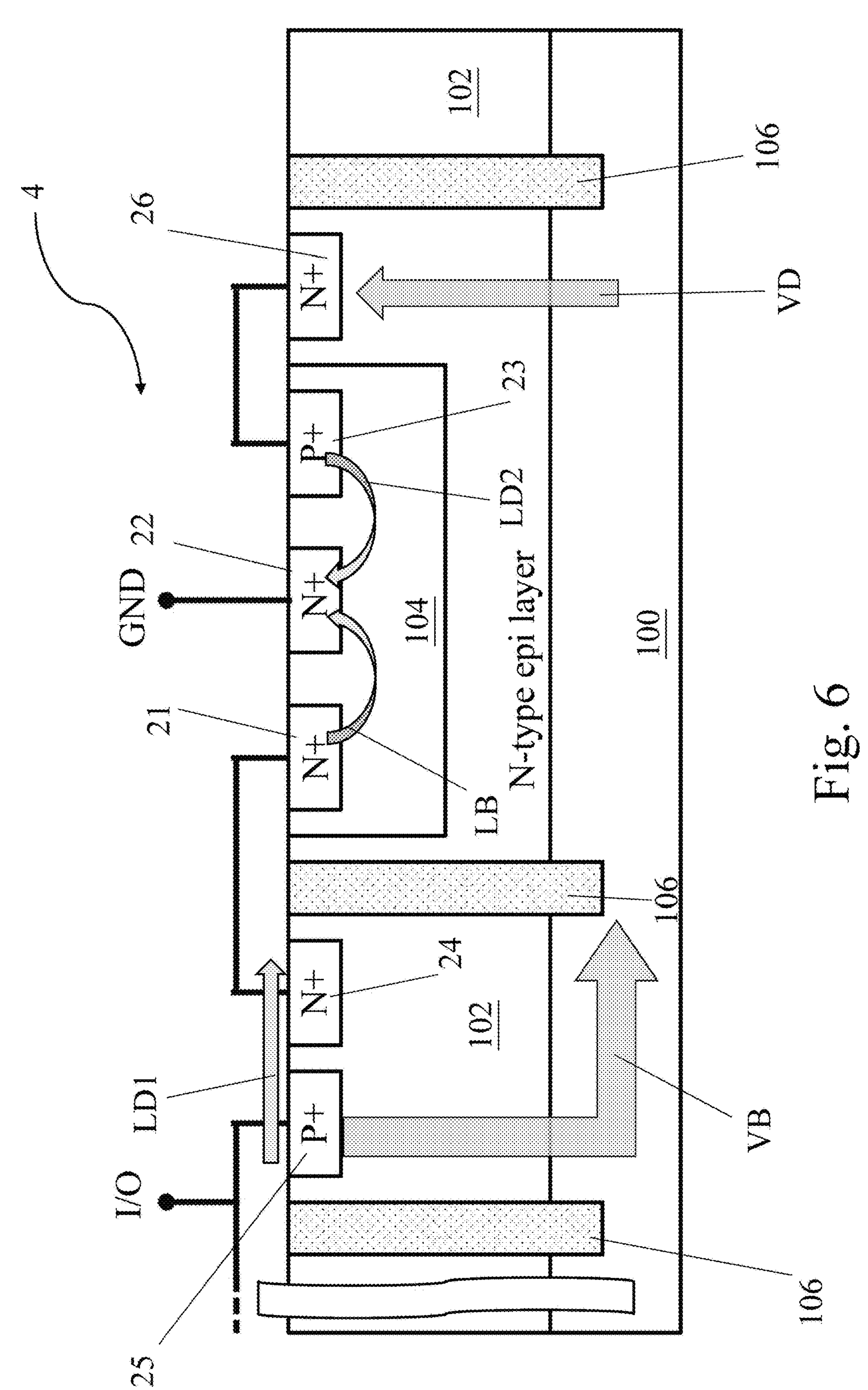
FIG. 6 schematically shows a drawing of the disclosed transient voltage suppressor structure in view of FIG. 5, when the positive surged operating mode is applied, and the multiple discharging paths are formed, where each discharging path is illustrated by arrows in the figure.

As can be seen in FIG. 6, when the first pin and the second pin are electrically coupled to the ground terminal GND and to the input and output terminal I/O, respectively for providing a positive surged operating mode, the disclosed transient voltage suppressor structure having multiple discharging paths is formed, comprising at least a first lateral diode conducting path LD1, a lateral n-p-n bipolar junction transistor conducting path LB, a vertical p-n-p bipolar junction transistor conducting path VB, a vertical diode conducting path VD and a second lateral diode conducting path LD2.

To be specifically, as referring to FIG. 6 and as indicated by the arrows in this figure, it is illustrative that the formed first lateral diode conducting path LD1 is constructed from the input and output terminal I/O, the fifth heavily doped region 25 of the first conductivity type (P+), the epitaxial layer 102 of the second conductivity type (N-type epi layer) to the fourth heavily doped region 24 of the second conductivity type (N+).

Moreover, the lateral n-p-n bipolar junction transistor conducting path LB is constructed from the first heavily doped region 21 of the second conductivity type (N+), the doped well region 104 of the first conductivity type (P-type well), the second heavily doped region 22 of the second conductivity type (N+) to the ground terminal GND.

In addition, the vertical p-n-p bipolar junction transistor conducting path VB is constructed from the input and output terminal I/O, the fifth heavily doped region 25 of the first conductivity type (P+), the epitaxial layer 102 of the second conductivity type (N-type epi layer) to the semiconductor substrate 100 of the first conductivity type (P-type sub).

Due to the configuration of the sixth heavily doped region 26 of the second conductivity type (N+) which is further disposed in the epitaxial layer 102 of the second conductivity type (N-type epi layer), the vertical diode conducting path VD is further formed, and is constructed from the semiconductor substrate 100 of the first conductivity type (P-type sub), the epitaxial layer 102 of the second conductivity type (N-type epi layer) to the sixth heavily doped region 26 of the second conductivity type (N+).

Moreover, since the sixth heavily doped region 26 of the second conductivity type (N+) in the epitaxial layer 102 of the second conductivity type (N-type epi layer) is further electrically connected in common with the third heavily doped region 23 of the first conductivity type (P+) in the doped well region 104 of the first conductivity type (P-type well), a second lateral diode conducting path LD2 is formed, and is constructed from the third heavily doped region 23 of the first conductivity type (P+), the doped well region 104 of the first conductivity type (P-type well), the second heavily doped region 22 of the second conductivity type (N+) to the ground terminal GND.

As we know, during a normal operation of the disclosed transient voltage suppressor structure, even though a plurality of discharging paths are formed when a transient event is generated, there should be no leakage path generated therein the transient voltage suppressor device. In other words, according to the embodiment of the present invention as shown in FIG. 6, when a power supply voltage, for instance, a VDD is injected to the input and output terminal I/O, then a voltage level of the power supply voltage VDD should be less than a first turn-on voltage for turning on the above mentioned first lateral diode conducting path LD1 and the lateral n-p-n bipolar junction transistor conducting path LB.

Apart from these, the voltage level of the power supply voltage VDD should be also controlled as being less than a second turn-on voltage for turning on the above mentioned vertical p-n-p bipolar junction transistor conducting path VB, the vertical diode conducting path VD and the second lateral diode conducting path LD2 for the purpose of suppressing and avoiding the unexpected leakage currents to be generated in the disclosed transient voltage suppressor structure of the present invention.

In view of the above-mentioned technical descriptions, it is believed that when a positive surged operating mode is applied thereto the disclosed application, the transient voltage suppressor structure having multiple discharging paths is effectively formed.

Figure 7:
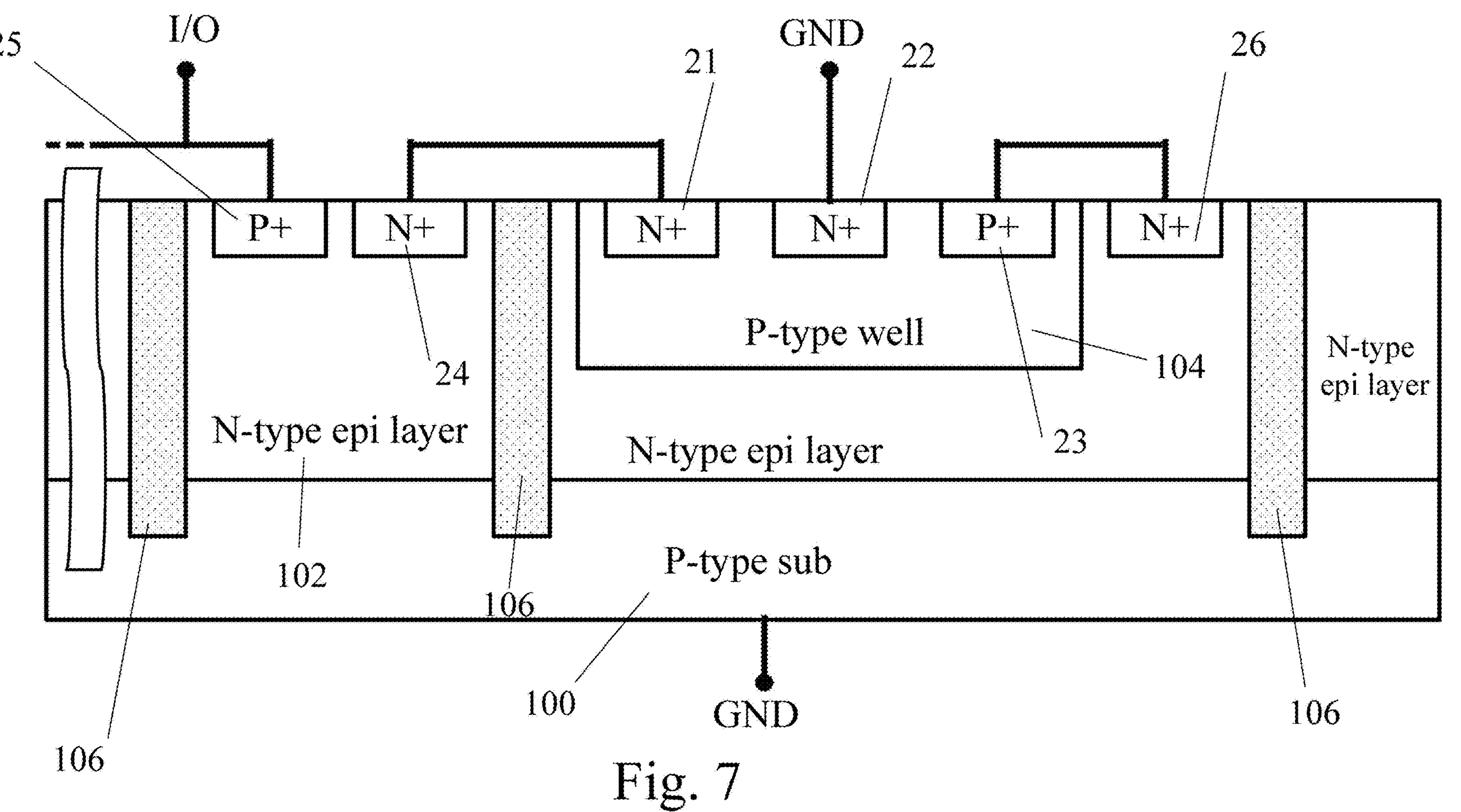
FIG. 7 schematically shows a layout structural diagram of another proposed transient voltage suppressor structure having multiple discharging paths in accordance with a second embodiment of the present invention, wherein the semiconductor substrate of the first conductivity type (P-type sub) is further electrically connected to the ground terminal for generating an additional vertically-grounding conducting path (VG).

And additionally, please proceed to refer to FIG. 7, which schematically shows a layout structural diagram of another proposed transient voltage suppressor structure having multiple discharging paths in accordance with a second embodiment of the present invention. FIG. 7 is a modification from the FIG. 5 embodiment. As can be seen in the layout structural diagram of FIG. 7, the semiconductor substrate 100 of the first conductivity type (P-type sub) can be alternatively further electrically connected to the first pin P1, which is the ground terminal GND, and the second pin P2 is electrically coupled to the input and output terminal I/O.

Under such an operation mode, when the first pin P1 and the semiconductor substrate 100 of the first conductivity type (P-type sub) are electrically coupled to the ground terminal GND in common, and the second pin P2 is electrically coupled to the input and output terminal I/O, it is evident that a positive surged operating mode is applied to the transient voltage suppressor structure of FIG. 7. At this time, the disclosed transient voltage suppressor structure is also formed, having multiple discharging paths. Please refer to FIG. 8, which schematically shows a drawing of the disclosed transient voltage suppressor structure in view of FIG. 7, when the positive surged operating mode is applied, and the multiple discharging paths are formed, where each discharging path may also be illustrated by arrows in the figure.

Figure 8:
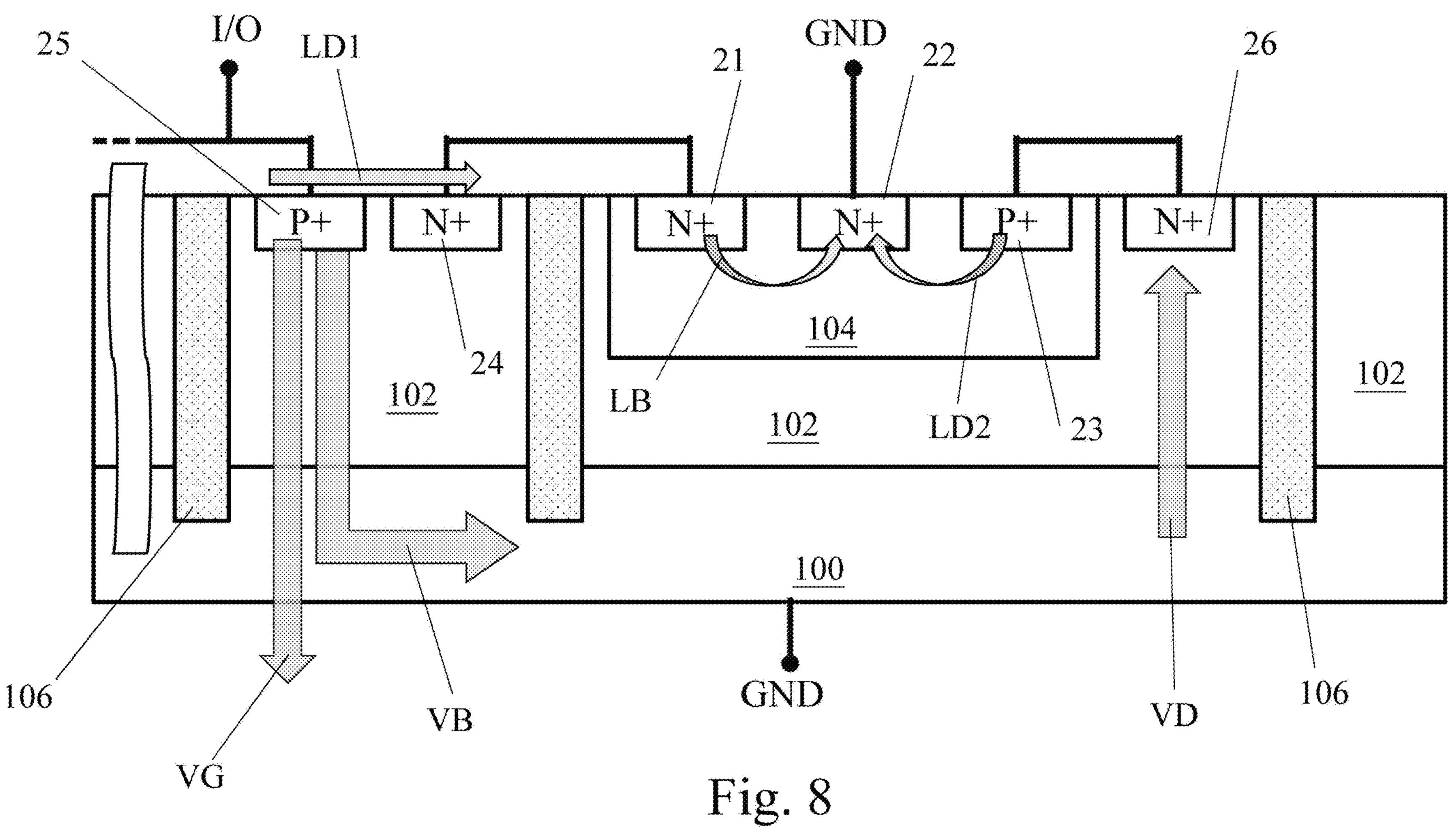
FIG. 8 schematically shows a drawing of the disclosed transient voltage suppressor structure in view of FIG. 7, when the positive surged operating mode is applied, and the multiple discharging paths are formed, where each discharging path is illustrated by arrows in the figure.

As can be seen in FIG. 8, when the first pin and the second pin are electrically coupled to the ground terminal GND and to the input and output terminal I/O, respectively for providing a positive surged operating mode, the disclosed transient voltage suppressor structure having multiple discharging paths is thus formed, comprising at least a first lateral diode conducting path LD1, a lateral n-p-n bipolar junction transistor conducting path LB, a vertical p-n-p bipolar junction transistor conducting path VB, a vertical diode conducting path VD, a second lateral diode conducting path LD2, and a vertically-grounding conducting path VG.

In addition to the first lateral diode conducting path LD1, the lateral n-p-n bipolar junction transistor conducting path LB, the vertical p-n-p bipolar junction transistor conducting path VB, the vertical diode conducting path VD, and the second lateral diode conducting path LD2, the vertically-grounding conducting path VG is generated in the second embodiment of the present invention as shown in FIG. 7 and FIG. 8, due to the semiconductor substrate 100 of the first conductivity type (P-type sub) further coupled with the ground terminal GND.

As described earlier in the previously disclosed embodiment in FIG. 6, the first lateral diode conducting path LD1 is constructed from the input and output terminal I/O, the fifth heavily doped region 25 of the first conductivity type (P+), the epitaxial layer 102 of the second conductivity type (N-type epi layer) to the fourth heavily doped region 24 of the second conductivity type (N+). The lateral n-p-n bipolar junction transistor conducting path LB is constructed from the first heavily doped region 21 of the second conductivity type (N+), the doped well region 104 of the first conductivity type (P-type well), the second heavily doped region 22 of the second conductivity type (N+) to the ground terminal GND. The vertical p-n-p bipolar junction transistor conducting path VB is constructed from the input and output terminal I/O, the fifth heavily doped region 25 of the first conductivity type (P+), the epitaxial layer 102 of the second conductivity type (N-type epi layer) to the semiconductor substrate 100 of the first conductivity type (P-type sub). The vertical diode conducting path VD is constructed from the semiconductor substrate 100 of the first conductivity type (P-type sub), the epitaxial layer 102 of the second conductivity type (N-type epi layer) to the sixth heavily doped region 26 of the second conductivity type (N+). And the second lateral diode conducting path LD2 is constructed from the third heavily doped region 23 of the first conductivity type (P+), the doped well region 104 of the first conductivity type (P-type well), the second heavily doped region 22 of the second conductivity type (N+) to the ground terminal GND. What draws our attention is that, when the semiconductor substrate 100 of the first conductivity type (P-type sub) is further electrically connected to the ground terminal GND as shown in the second embodiment of FIG. 7 and FIG. 8, then an additional discharging path from the input and output terminal I/O to the ground terminal GND is obtained, which is the vertically-grounding conducting path VG. According to the second embodiment as illustrated in FIG. 7 and FIG. 8, it can be seen that such a vertically-grounding conducting path VG is constructed from the input and output terminal I/O, the fifth heavily doped region 25 of the first conductivity type (P+), the epitaxial layer 102 of the second conductivity type (N-type epi layer), the semiconductor substrate 100 of the first conductivity type (P-type sub) to the ground terminal GND.

In view of the above-mentioned technical descriptions, it is believed that when a positive surged operating mode is applied thereto the disclosed second embodiment of the present invention (referring to FIG. 7 and FIG. 8), then a transient voltage suppressor structure having multiple discharging paths is further formed.

Figure 9:
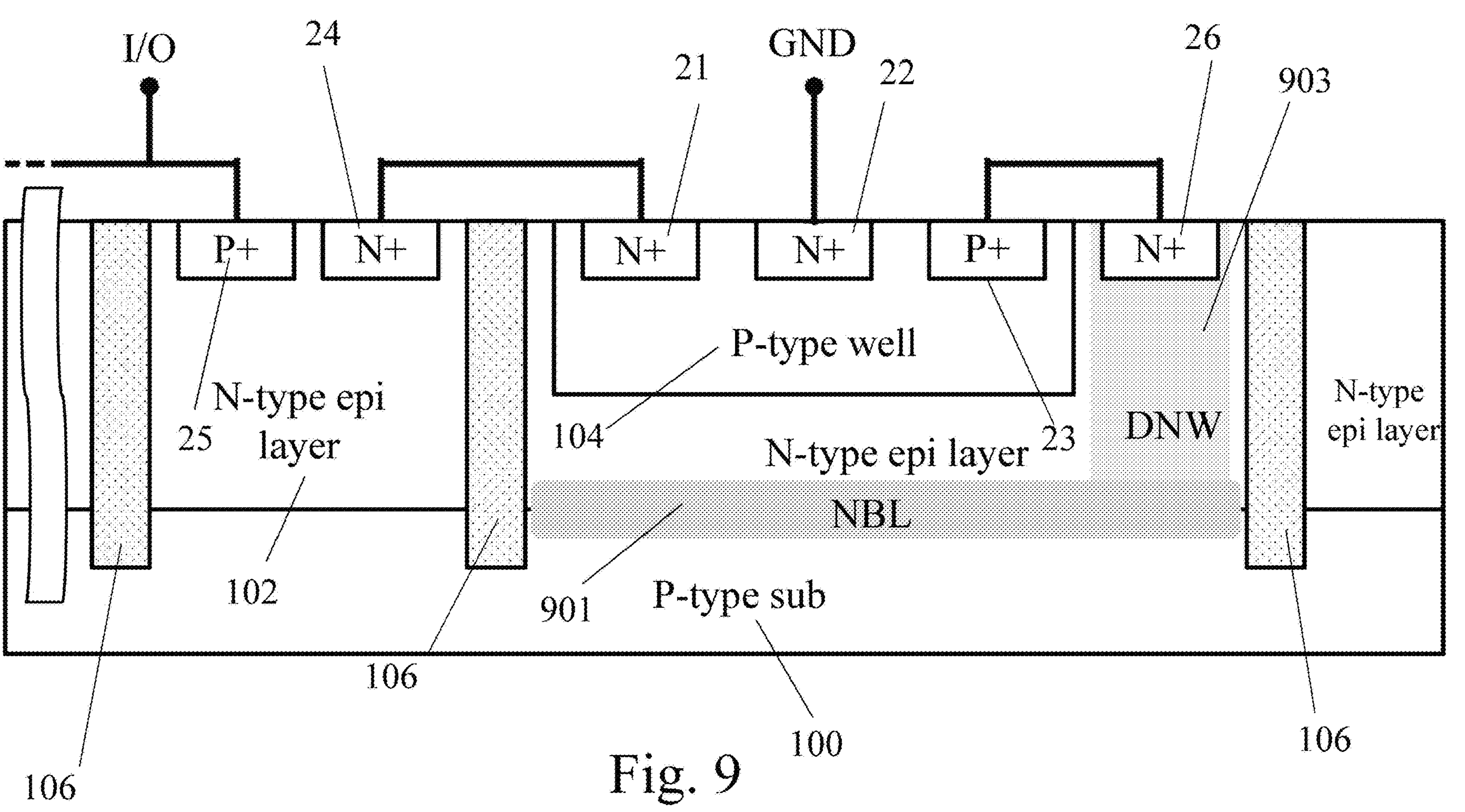
FIG. 9 schematically shows a layout structural diagram of another proposed transient voltage suppressor structure having multiple discharging paths in accordance with a third embodiment of the present invention, wherein a buried layer of the second conductivity type (NBL) is further disposed between the semiconductor substrate of the first conductivity type (P-type sub) and the epitaxial layer of the second conductivity type (N-type epi layer), and a deep doped well region of the second conductivity type (DNW) is further disposed in the epitaxial layer of the second conductivity type (N-type epi layer) for accommodating the sixth heavily doped region of the second conductivity type (N+) so as to reduce an on-resistance ($R_{on}$) of the disclosed transient voltage suppressor structure.

And yet, furthermore, please refer to FIG. 9, which schematically shows a layout structural diagram of one another proposed transient voltage suppressor structure having multiple discharging paths in accordance with a third embodiment of the present invention. FIG. 9 is another modification from the FIG. 5 embodiment. As can be seen in the layout structural diagram of FIG. 9, in addition to the semiconductor substrate 100 of the first conductivity type (P-type sub), the epitaxial layer 102 of the second conductivity type (N-type epi layer), the doped well region 104 of the first conductivity type (P-type well), the first heavily doped region 21 of the second conductivity type (N+), the second heavily doped region 22 of the second conductivity type (N+), the third heavily doped region 23 of the first conductivity type (P+), the fourth heavily doped region 24 of the second conductivity type (N+), the fifth heavily doped region 25 of the first conductivity type (P+) and the sixth heavily doped region 26 of the second conductivity type (N+), the disclosed transient voltage suppressor structure further comprises: a buried layer of the second conductivity type 901 and a deep doped well region of the second conductivity type 903. While regarding the disclosed first conductivity type as being a P-type conductivity type and the second conductivity type as being an N-type conductivity type, under such a conductivity type configuration, it is illustrative that the buried layer 901 of the second conductivity type is indicated by a "NBL" as an N-type buried layer. And the deep doped well region 903 of the second conductivity type 903 is indicated by a "DNW" as an N-type deep well region.

According to the third embodiment of the present invention in FIG. 9, the buried layer 901 of the second conductivity type (NBL) is disposed between the semiconductor substrate 100 of the first conductivity type (P-type sub) and the epitaxial layer 102 of the second conductivity type (N-type epi layer). The deep doped well region 903 of the second conductivity type (DNW) is disposed in the epitaxial layer 102 of the second conductivity type (N-type epi layer) for accommodating the above mentioned sixth heavily doped region 26 of the second conductivity type (N+). In addition, the deep doped well region 903 of the second conductivity type (DNW) is isolated from the doped well region 104 of the first conductivity type (P-type well) and the deep doped well region 903 of the second conductivity type (DNW) is in connection with the buried layer 901 of the second conductivity type (NBL). In view of the third embodiment of the present invention in FIG. 9, in order to be in contact with the buried layer 901 of the second conductivity type (NBL), a depth of the deep doped well region 903 of the second conductivity type (DNW) should be greater than a depth of the doped well region 104 of the first conductivity type (P-type well). For instance, a depth of the deep doped well region 903 of the second conductivity type (DNW) can be for example, in a range between 3 to 5 micrometers (μm).

Moreover, regarding the third embodiment of the present invention as illustrated in FIG. 9, a doped concentration of the buried layer 901 of the second conductivity type (NBL) is greater than a doped concentration of the epitaxial layer 102 of the second conductivity type (N-type epi layer) so as to reduce an on-resistance ($R_{on}$) of the disclosed transient voltage suppressor structure in FIG. 9. For instance, in a feasible doped concentration configuration, a doped concentration of the buried layer 901 of the second conductivity type (NBL) can be, for example, in a range between $10^{18}$ $cm^{-3}$ to $10^{19}$ $cm^{-3}$. And the doped concentration of the epitaxial layer 102 of the second conductivity type (N-type epi layer) can be, for example, in a range between $10^{14}$ $cm^{-3}$ to $10^{15}$ $cm^{-3}$.

Subsequently, by further disposing the buried layer 901 of the second conductivity type (NBL) as well as the deep doped well region 903 of the second conductivity type (DNW) in the disclosed transient voltage suppressor structure, multiple discharging paths can be formed. Please proceed to refer to FIG. 10, which schematically shows a drawing of the disclosed transient voltage suppressor structure in view of FIG. 9, when the positive surged operating mode is applied, and the multiple discharging paths are formed, where each discharging path may also be illustrated by arrows in the figure.

Figure 10:
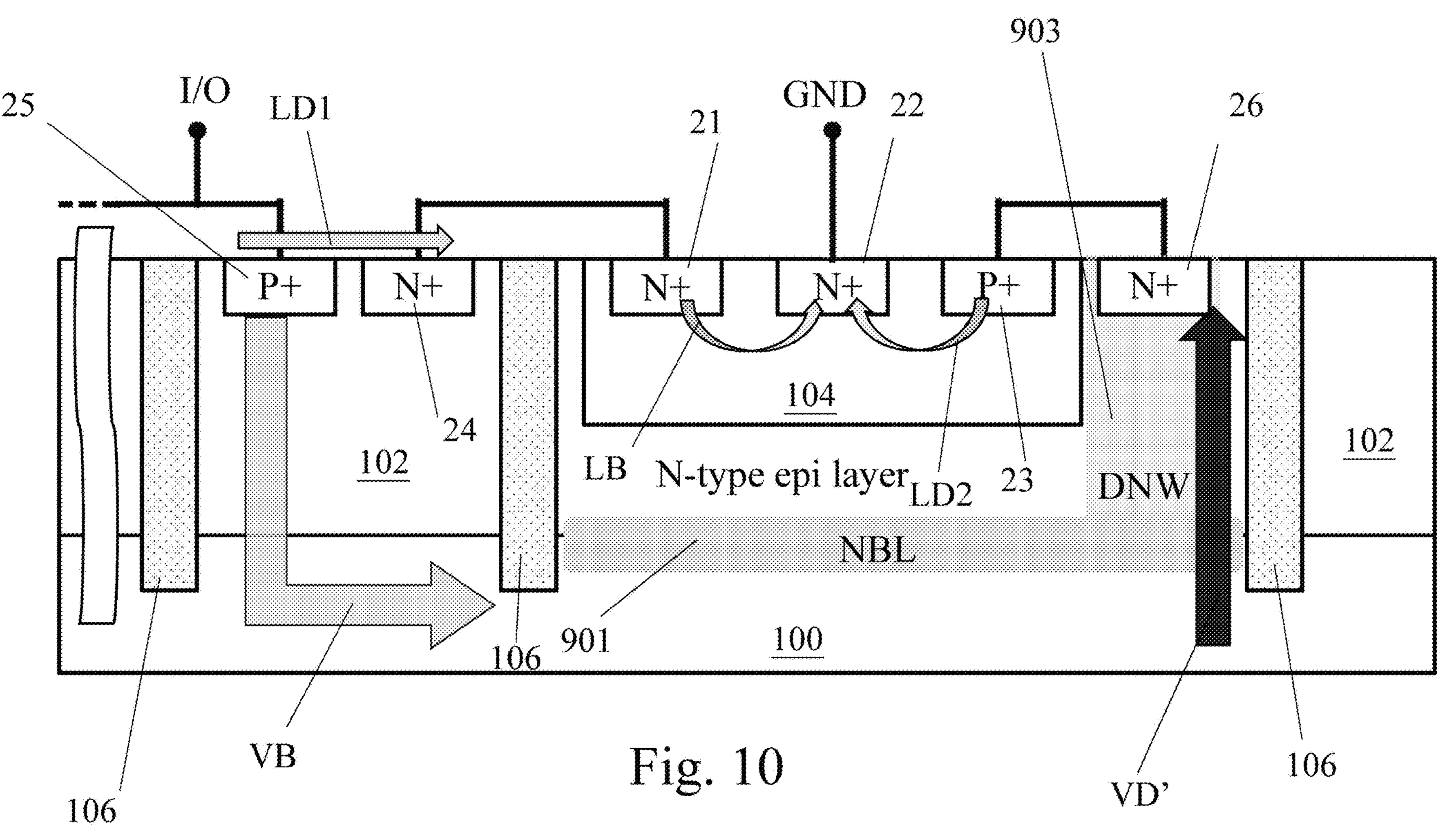
FIG. 10 schematically shows a drawing of the disclosed transient voltage suppressor structure in view of FIG. 9, when the positive surged operating mode is applied, and the multiple discharging paths are formed, where each discharging path is illustrated by arrows in the figure.

As can be seen in FIG. 10, when the first pin and the second pin are electrically coupled to the ground terminal GND and to the input and output terminal I/O, respectively for providing a positive surged operating mode, the disclosed transient voltage suppressor structure having multiple discharging paths is thus formed, comprising at least a first lateral diode conducting path LD1, a lateral n-p-n bipolar junction transistor conducting path LB, a vertical p-n-p bipolar junction transistor conducting path VB, a vertical diode conducting path VD', and a second lateral diode conducting path LD2.

As described earlier in the previously disclosed embodiment in FIG. 6, the first lateral diode conducting path LD1 is constructed from the input and output terminal I/O, the fifth heavily doped region 25 of the first conductivity type (P+), the epitaxial layer 102 of the second conductivity type (N-type epi layer) to the fourth heavily doped region 24 of the second conductivity type (N+). The lateral n-p-n bipolar junction transistor conducting path LB is constructed from the first heavily doped region 21 of the second conductivity type (N+), the doped well region 104 of the first conductivity type (P-type well), the second heavily doped region 22 of the second conductivity type (N+) to the ground terminal GND. The vertical p-n-p bipolar junction transistor conducting path VB is constructed from the input and output terminal I/O, the fifth heavily doped region 25 of the first conductivity type (P+), the epitaxial layer 102 of the second conductivity type (N-type epi layer) to the semiconductor substrate 100 of the first conductivity type (P-type sub). And the second lateral diode conducting path LD2 is constructed from the third heavily doped region 23 of the first conductivity type (P+), the doped well region 104 of the first conductivity type (P-type well), the second heavily doped region 22 of the second conductivity type (N+) to the ground terminal GND.

The difference is that, due to the buried layer 901 of the second conductivity type (NBL) as well as the deep doped well region 903 of the second conductivity type (DNW) configured in the disclosed transient voltage suppressor structure in FIG. 9, the vertical diode conducting path VD' is instead, constructed from the semiconductor substrate 100 of the first conductivity type (P-type sub), the buried layer 901 of the second conductivity type (NBL), the deep doped well region 903 of the second conductivity type (DNW) to the sixth heavily doped region 26 of the second conductivity type (N+). As a result, in view of the above-mentioned technical descriptions, it is believed that when the positive surged operating mode is applied thereto the disclosed third embodiment of the present invention (referring to FIG. 9 and FIG. 10), then a transient voltage suppressor structure having multiple discharging paths is effectively formed as well.

Figure 11:
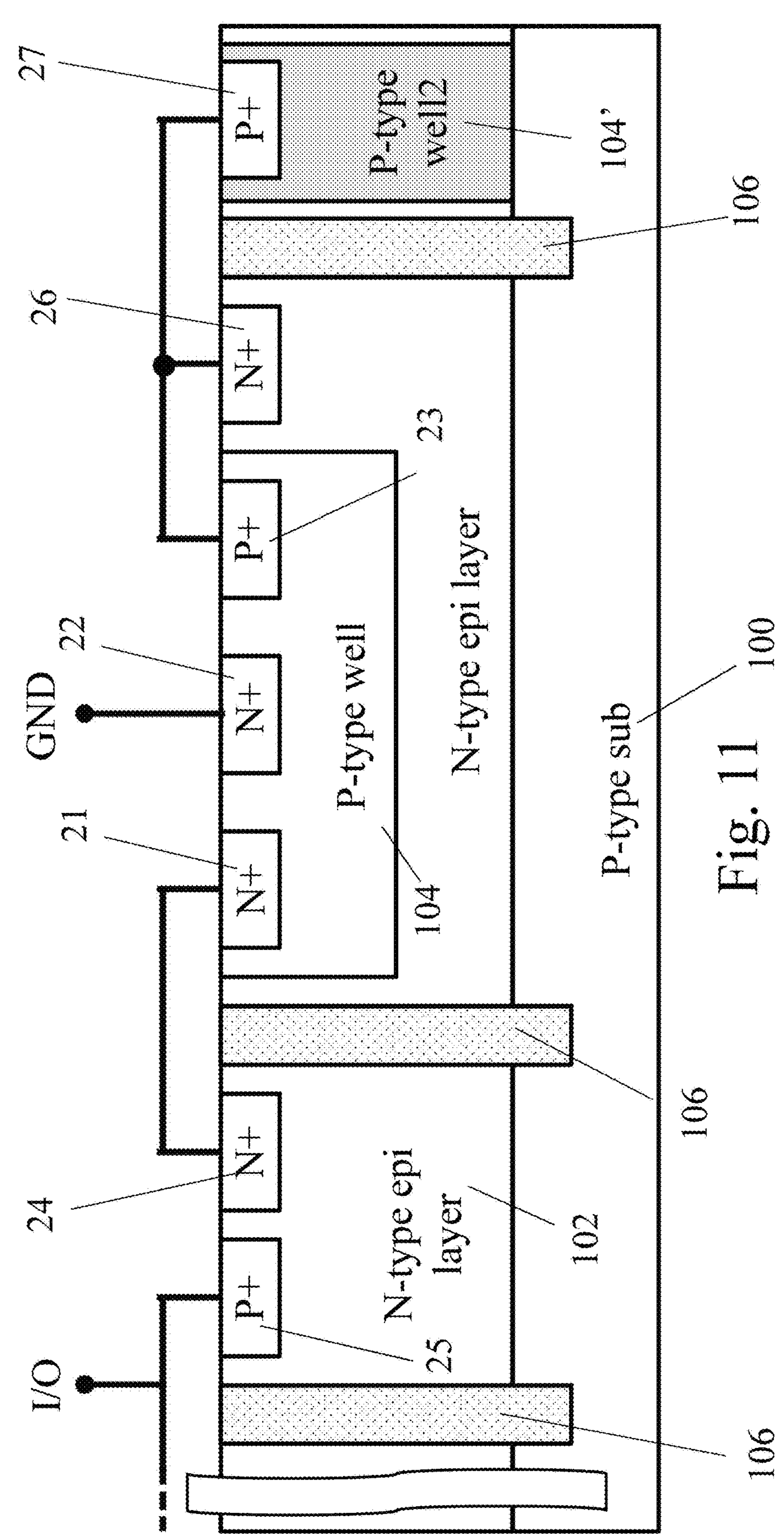
FIG. 11 schematically shows a layout structural diagram of another proposed transient voltage suppressor structure having multiple discharging paths in accordance with a fourth embodiment of the present invention, wherein a second doped well region of the first conductivity type (P-type well2) and a seventh heavily doped region of the first conductivity type (P+) are further disposed where the seventh heavily doped region of the first conductivity type (P+) is electrically coupled with the third heavily doped region of the first conductivity type (P+) and the sixth heavily doped region of the second conductivity type (N+) in common in order to further generate an additional vertical pick-up conducting path (VP).

And additionally, furthermore, please refer to FIG. 11, which schematically shows a layout structural diagram of one another proposed transient voltage suppressor structure having multiple discharging paths in accordance with a fourth embodiment of the present invention. FIG. 11 is one another modification from the FIG. 5 embodiment. As can be seen in the layout structural diagram of FIG. 11, in addition to the semiconductor substrate 100 of the first conductivity type (P-type sub), the epitaxial layer 102 of the second conductivity type (N-type epi layer), the doped well region 104 of the first conductivity type (P-type well), the first heavily doped region 21 of the second conductivity type (N+), the second heavily doped region 22 of the second conductivity type (N+), the third heavily doped region 23 of the first conductivity type (P+), the fourth heavily doped region 24 of the second conductivity type (N+), the fifth heavily doped region 25 of the first conductivity type (P+) and the sixth heavily doped region 26 of the second conductivity type (N+), the disclosed transient voltage suppressor structure further comprises: a second doped well region 104' of the first conductivity type and a seventh heavily doped region 27 of the first conductivity type. While regarding the disclosed first conductivity type as being a P-type conductivity type and the second conductivity type as being an N-type conductivity type, under such a conductivity type configuration, it is illustrative that second doped well region 104' of the first conductivity type is indicated by a "P-type well2" as a P-type doped well region. And the seventh heavily doped region 27 of the first conductivity type is indicated by a "P+" as a P-type heavily doped region.

According to the fourth embodiment of the present invention in FIG. 11, the second doped well region 104' of the first conductivity type (P-type well2) is disposed in the epitaxial layer 102 of the second conductivity type (N-type epi layer) for accommodating the seventh heavily doped region 27 of the first conductivity type (P+). In addition, the second doped well region 104' of the first conductivity type (P-type well2) and the seventh heavily doped region 27 of the first conductivity type (P+) are disposed apart from the sixth heavily doped region 26 of the second conductivity type (N+) by the isolation trench 106, and the seventh heavily doped region 27 of the first conductivity type (P+) is electrically coupled with the third heavily doped region 23 of the first conductivity type (P+) and the sixth heavily doped region 26 of the second conductivity type (N+) in common.

As a result, by further disposing the second doped well region 104' of the first conductivity type (P-type well2) and the seventh heavily doped region 27 of the first conductivity type (P+) where the seventh heavily doped region 27 of the first conductivity type (P+) is electrically coupled with the third heavily doped region 23 of the first conductivity type (P+) and the sixth heavily doped region 26 of the second conductivity type (N+) in common in the disclosed transient voltage suppressor structure in FIG. 11, multiple discharging paths can be formed. Please proceed to refer to FIG. 12, which schematically shows a drawing of the disclosed transient voltage suppressor structure in view of FIG. 11, when the positive surged operating mode is applied, and the multiple discharging paths are formed, where each discharging path may also be illustrated by arrows in the figure.

Figure 12:
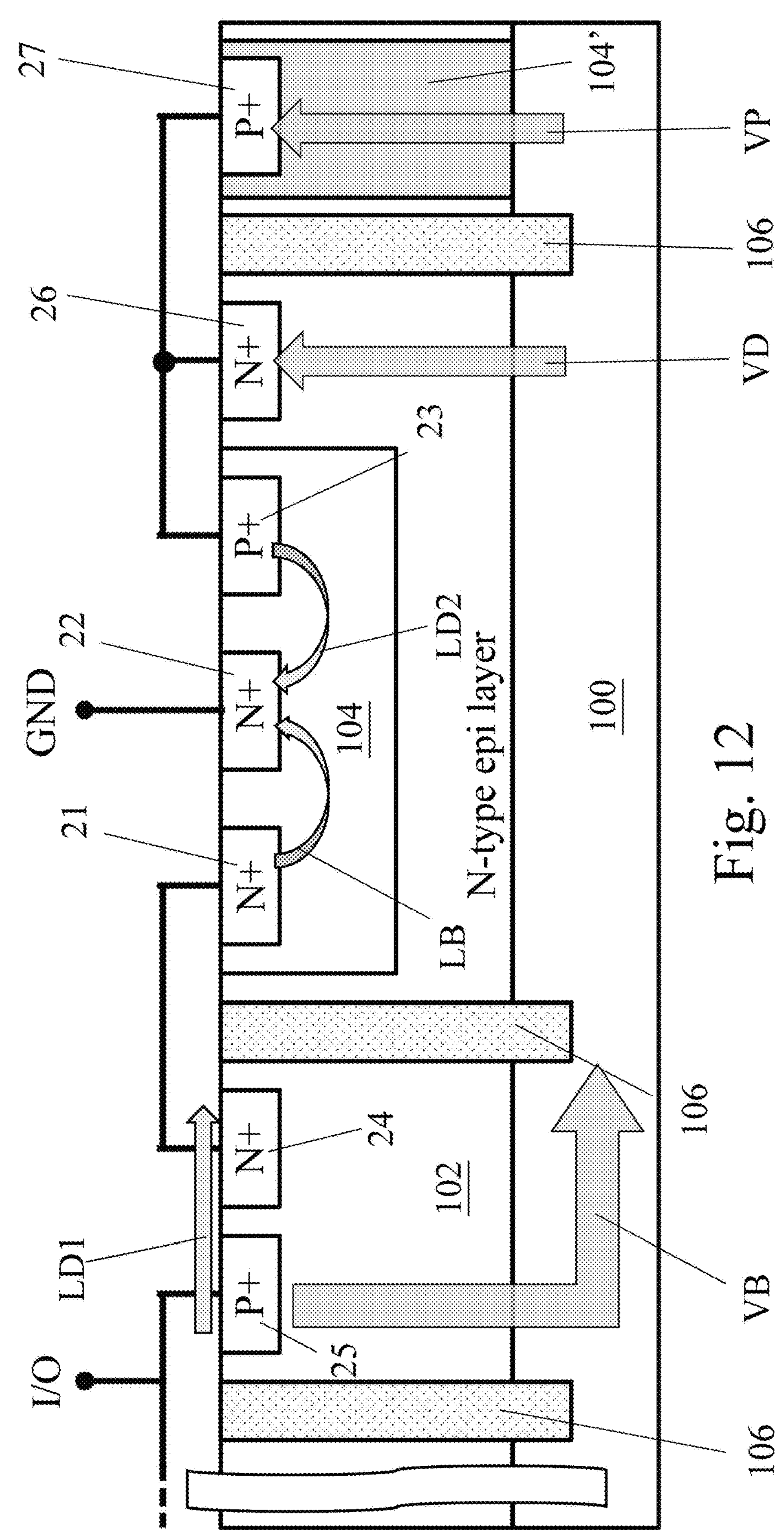
FIG. 12 schematically shows a drawing of the disclosed transient voltage suppressor structure in view of FIG. 11, when the positive surged operating mode is applied, and the multiple discharging paths are formed, where each discharging path is illustrated by arrows in the figure.

As can be seen in FIG. 12, when the first pin and the second pin are electrically coupled to the ground terminal GND and to the input and output terminal I/O, respectively for providing a positive surged operating mode, the disclosed transient voltage suppressor structure having multiple discharging paths is thus formed. And the plurality of discharging paths comprise at least a first lateral diode conducting path LD1, a lateral n-p-n bipolar junction transistor conducting path LB, a vertical p-n-p bipolar junction transistor conducting path VB, a vertical diode conducting path VD, a second lateral diode conducting path LD2 and an additional vertical pick-up conducting path VP.

Among the formed discharging paths, the first lateral diode conducting path LD1, the lateral n-p-n bipolar junction transistor conducting path LB, the vertical p-n-p bipolar junction transistor conducting path VB, the vertical diode conducting path VD, and the second lateral diode conducting path LD2 are the same as what the Applicants of the present invention have disclosed earlier in the previous embodiment, the additional vertical pick-up conducting path VP is formed due to the configuration of the second doped well region 104' of the first conductivity type (P-type well2) and the seventh heavily doped region 27 of the first conductivity type (P+) as illustrated in FIG. 11. And the vertical pick-up conducting path VP is constructed from the semiconductor substrate 100 of the first conductivity type (P-type sub), the second doped well region 104' of the first conductivity type (P-type well2) to the seventh heavily doped region 27 of the first conductivity type (P+). After that, the vertical pick-up conducting path VP is coupled with the sixth heavily doped region 26 of the second conductivity type (N+) and the third heavily doped region 23 of the first conductivity type (P+), and further in electrical connection with the second lateral diode conducting path LD2 to the ground terminal GND. As a result, it is believed that when the positive surged operating mode is applied thereto the disclosed fourth embodiment of the present invention (referring to FIG. 11 and FIG. 12), then another transient voltage suppressor structure having multiple discharging paths is effectively formed as well.

Figure 13:
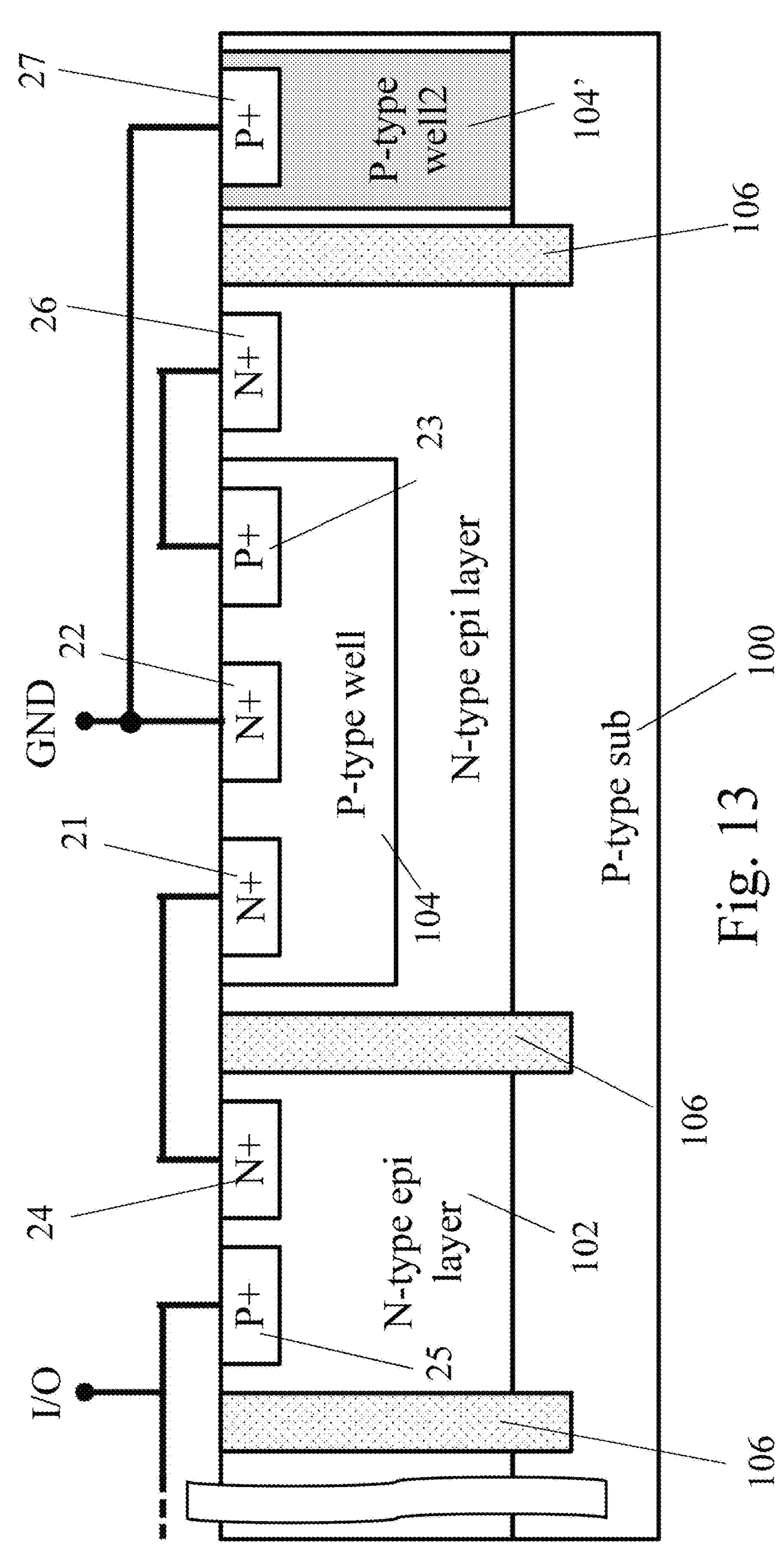
FIG. 13 schematically shows a layout structural diagram of another proposed transient voltage suppressor structure having multiple discharging paths in accordance with a fifth embodiment of the present invention, wherein a second doped well region of the first conductivity type (P-type well2) and a seventh heavily doped region of the first conductivity type (P+) are further disposed where the seventh heavily doped region of the first conductivity type (P+) is electrically coupled with the second heavily doped region 22 of the second conductivity type (N+) and the ground terminal in common in order to further generate an additional vertical pick-up conducting path (VP').

And in yet another aspect, please proceed to refer to FIG. 13, which schematically shows a layout structural diagram of one another proposed transient voltage suppressor structure having multiple discharging paths in accordance with a fifth embodiment of the present invention. FIG. 13 is a modification from the FIG. 11 embodiment. As can be seen in the layout structural diagram of FIG. 13, what differs from the fourth embodiment in FIG. 11 is that, according to the fifth embodiment in FIG. 13, the seventh heavily doped region 27 of the first conductivity type (P+) is electrically coupled with the second heavily doped region 22 of the second conductivity type (N+) and the first pin in common. When the first conductivity type is a P-type conductivity type, then the first pin, the second heavily doped region 22 of the second conductivity type (N+) and the seventh heavily doped region 27 of the first conductivity type (P+) are commonly connected to the ground terminal GND. According to the fifth embodiment of the present invention in FIG. 13, FIG. 14 schematically shows a drawing of the disclosed transient voltage suppressor structure in view of FIG. 13, when the positive surged operating mode is applied, and the multiple discharging paths are formed, where each discharging path may also be illustrated by arrows in the figure.

Figure 14:
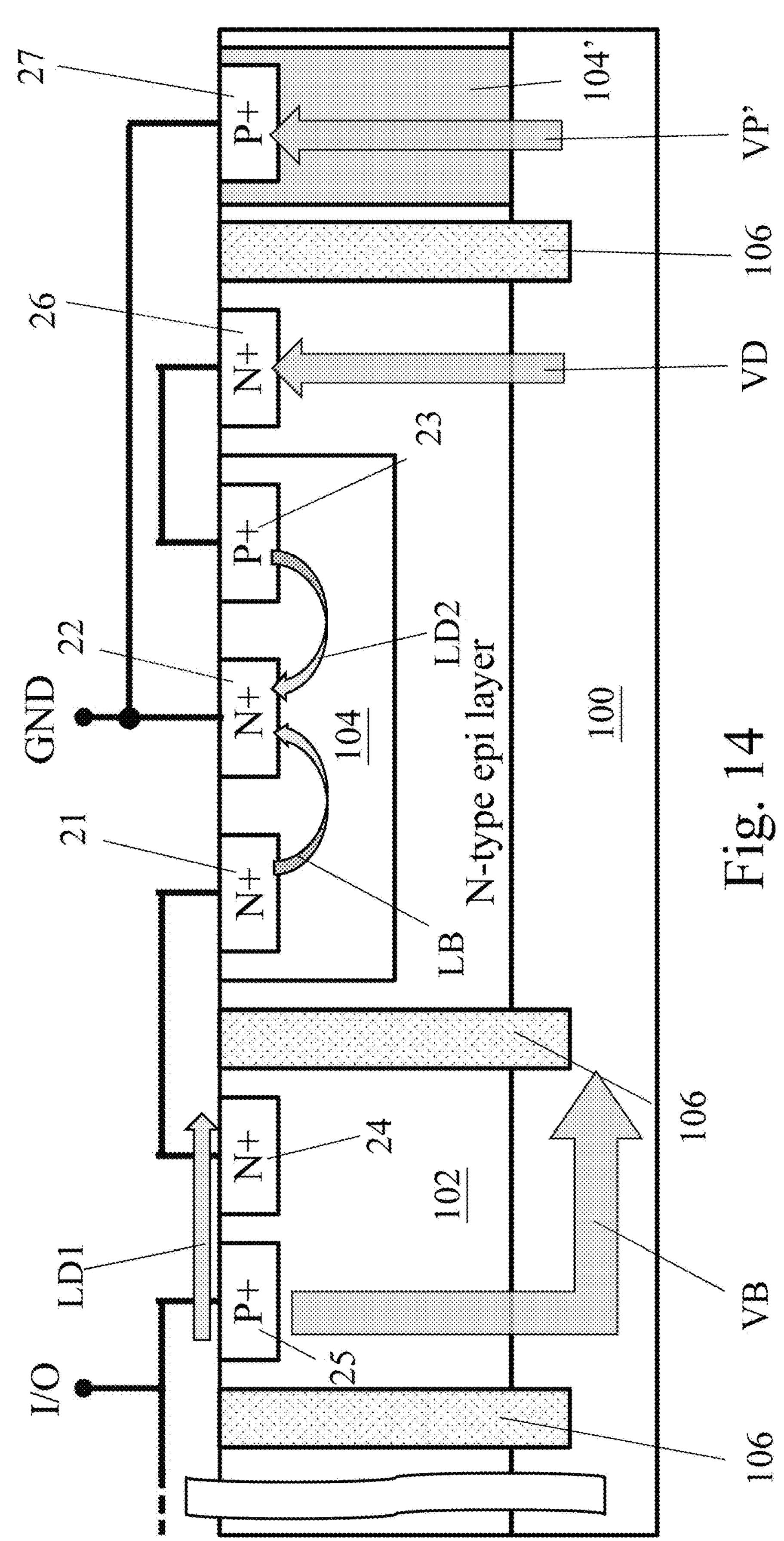
FIG. 14 schematically shows a drawing of the disclosed transient voltage suppressor structure in view of FIG. 13, when the positive surged operating mode is applied, and the multiple discharging paths are formed, where each discharging path is illustrated by arrows in the figure.

As can be seen in FIG. 14, when the first pin and the second pin are electrically coupled to the ground terminal GND and to the input and output terminal I/O, respectively for providing a positive surged operating mode, the disclosed transient voltage suppressor structure having multiple discharging paths may also be formed. And the plurality of discharging paths comprise the first lateral diode conducting path LD1, the lateral n-p-n bipolar junction transistor conducting path LB, the vertical p-n-p bipolar junction transistor conducting path VB, the vertical diode conducting path VD, and the second lateral diode conducting path LD2 as discussed previously in the earlier paragraphs. An additional vertical pick-up conducting path VP' is formed herein the fifth embodiment.

According to the fifth embodiment of the present invention, since the second heavily doped region 22 of the second conductivity type (N+) and the seventh heavily doped region 27 of the first conductivity type (P+) are commonly connected to the ground terminal GND, the vertical pick-up conducting path VP' is therefore, constructed from the semiconductor substrate 100 of the first conductivity type (P-type sub), the second doped well region 104' of the first conductivity type (P-type well2), the seventh heavily doped region 27 of the first conductivity type (P+) and directly to the ground terminal GND.

Figure 15:
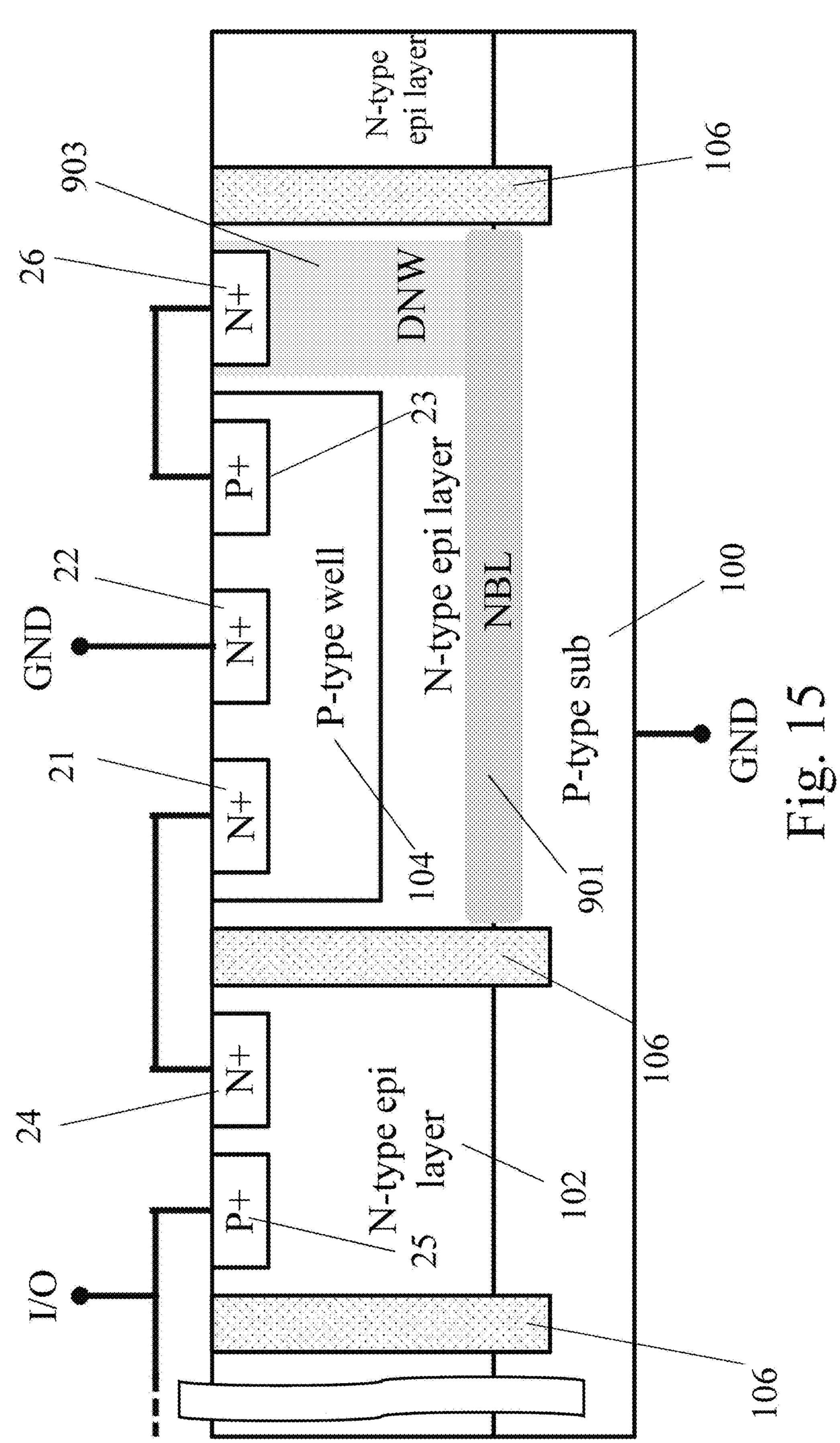
FIG. 15 schematically shows a layout structural diagram of another proposed transient voltage suppressor structure having multiple discharging paths in accordance with a sixth embodiment of the present invention, wherein the semiconductor substrate of the first conductivity type (P-type sub) in FIG. 9 can be further electrically connected to the ground terminal.

And yet, please refer to FIG. 15, which schematically shows a layout structural diagram of one another proposed transient voltage suppressor structure having multiple discharging paths in accordance with a sixth embodiment of the present invention. FIG. 15 is one another modification from the FIG. 9 embodiment. As can be seen in the layout structural diagram of FIG. 15, then based on a circuit diagram of the disclosed transient voltage suppressor structure having multiple discharging paths in FIG. 9, the semiconductor substrate 100 of the first conductivity type (P-type sub) can be further electrically connected to the first pin, which is the ground terminal GND, as well. Such a variant embodiment may also be adopted for implementing the present invention.

Figure 16:
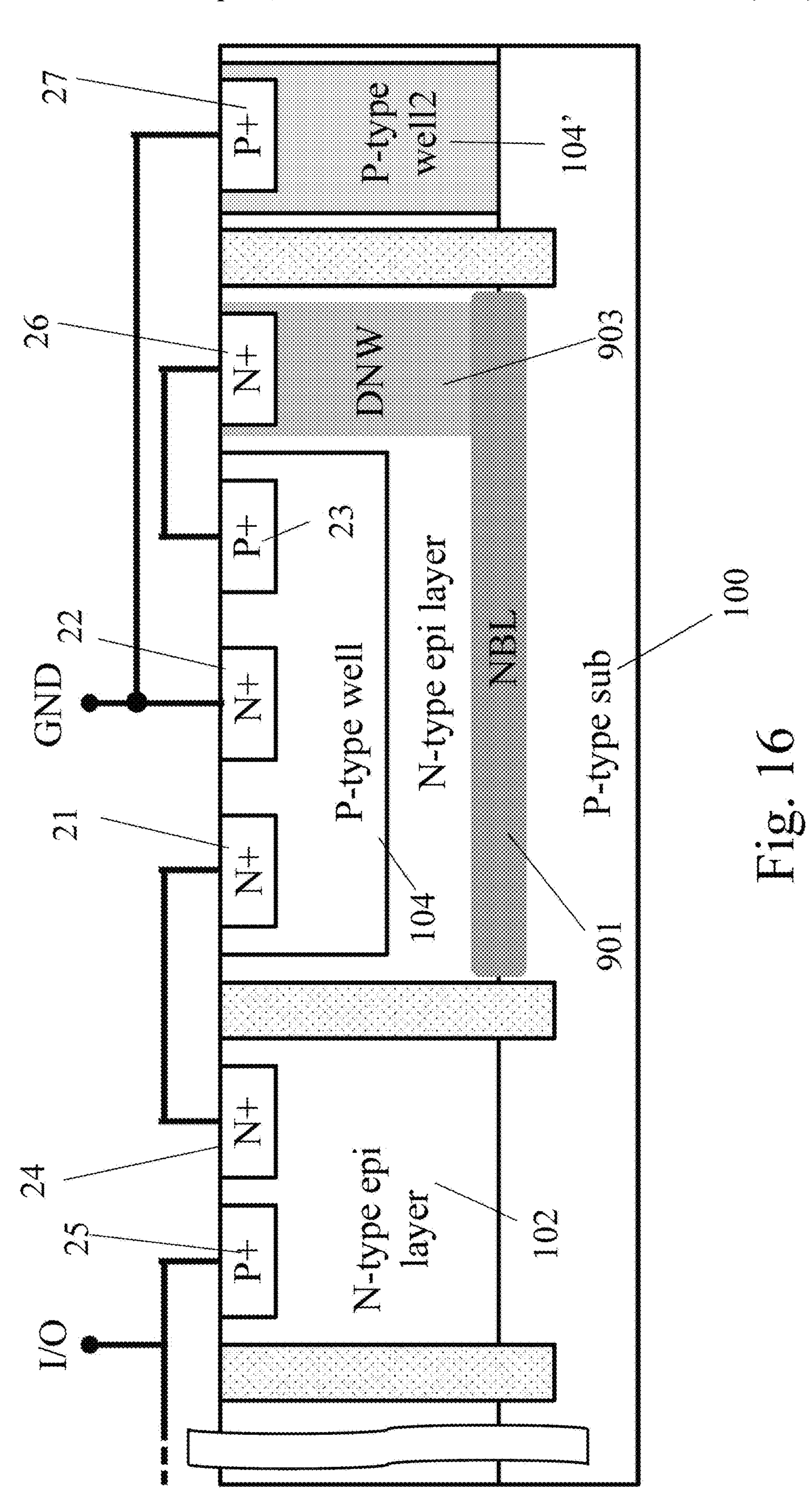
FIG. 16 schematically shows a layout structural diagram of another proposed transient voltage suppressor structure having multiple discharging paths in accordance with a seventh embodiment of the present invention, wherein the disclosed transient voltage suppressor structure in FIG. 9 can be alternatively comprise the second doped well region of the first conductivity type (P-type well2) and the seventh heavily doped region of the first conductivity type (P+), where the seventh heavily doped region of the first conductivity type (P+) is electrically coupled with the second heavily doped region of the second conductivity type (N+) and the ground terminal in common.

Moreover, FIG. 16 schematically shows a layout structural diagram of one another proposed transient voltage suppressor structure having multiple discharging paths in accordance with a seventh embodiment of the present invention, wherein FIG. 16 is one another modification from the FIG. 9 embodiment. As can be seen in the layout structural diagram of FIG. 16, based on a circuit diagram of the disclosed transient voltage suppressor structure having multiple discharging paths in FIG. 9, then the second doped well region 104' of the first conductivity type (P-type well2) and the seventh heavily doped region 27 of the first conductivity type (P+) can be further disposed as well, where the seventh heavily doped region 27 of the first conductivity type (P+) is electrically coupled with the second heavily doped region 22 of the second conductivity type (N+) and the ground terminal GND in common.

Figure 17:
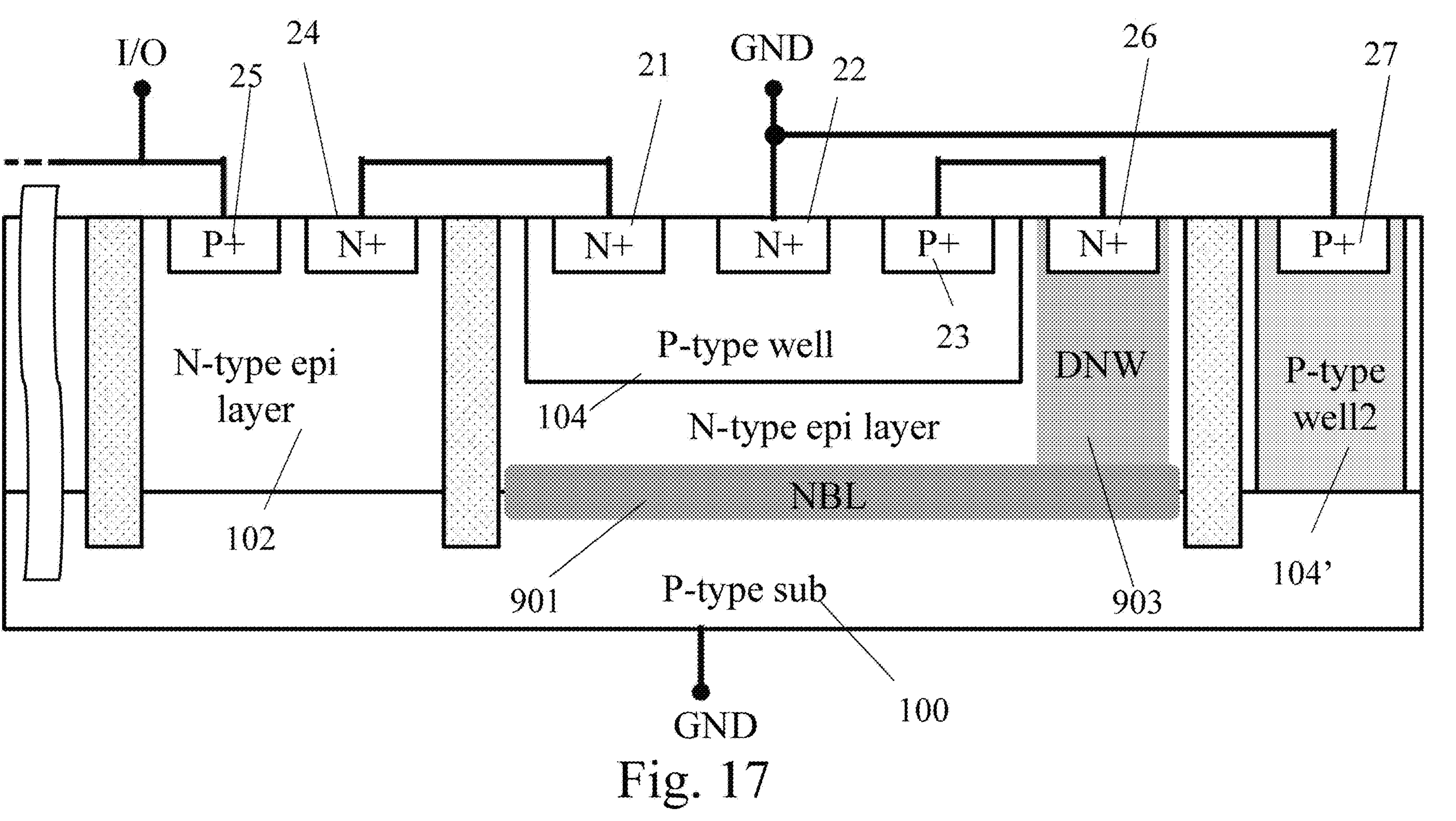
FIG. 17 schematically shows a layout structural diagram of another proposed transient voltage suppressor structure having multiple discharging paths in accordance with an eighth embodiment of the present invention, wherein the semiconductor substrate of the first conductivity type (P-type sub) in FIG. 16 can be further electrically connected to the ground terminal.

And yet, FIG. 17 schematically shows a layout structural diagram of one another proposed transient voltage suppressor structure having multiple discharging paths in accordance with an eighth embodiment of the present invention, wherein FIG. 17 is a modification from the FIG. 16 embodiment. As can be seen in the layout structural diagram of FIG. 17, based on a circuit diagram of the disclosed transient voltage suppressor structure having multiple discharging paths in FIG. 16, then the semiconductor substrate 100 of the first conductivity type (P-type sub) may also be further electrically connected to the first pin, which is the ground terminal GND, as well. It is believed that a variant embodiment as disclosed in the eighth embodiment illustrated in FIG. 17, comprising the buried layer 901 of the second conductivity type (NBL), the deep doped well region 903 of the second conductivity type (DNW), the second doped well region 104' of the first conductivity type (P-type well2), the seventh heavily doped region 27 of the first conductivity type (P+) and the semiconductor substrate 100 of the first conductivity type (P-type sub) coupled to the ground terminal GND, may also be adopted for implementing the present invention.

Figure 18:
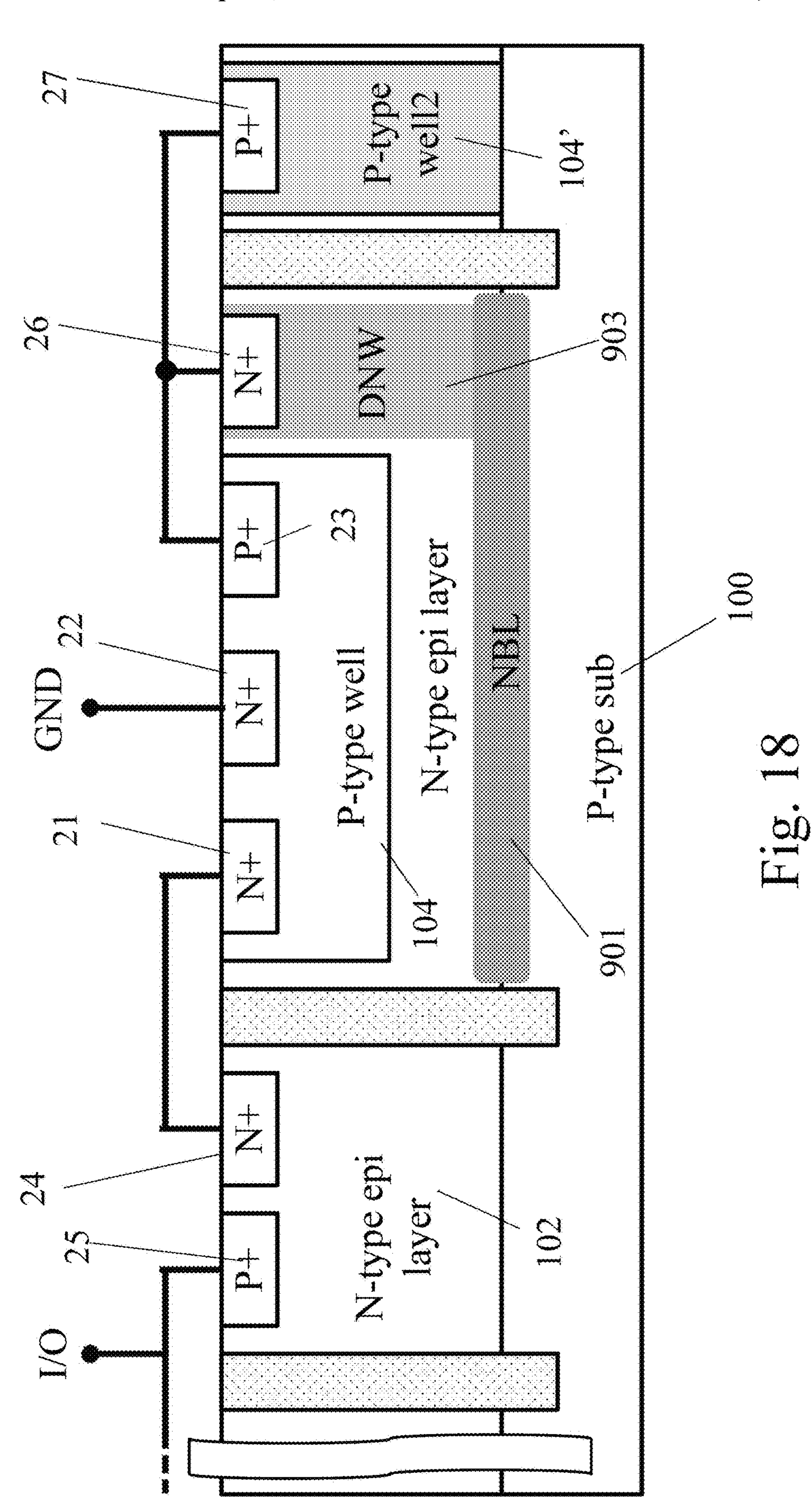
FIG. 18 schematically shows a layout structural diagram of another proposed transient voltage suppressor structure having multiple discharging paths in accordance with a ninth embodiment of the present invention, wherein the disclosed transient voltage suppressor structure in FIG. 9 can be alternatively comprise the second doped well region of the first conductivity type (P-type well2) and the seventh heavily doped region of the first conductivity type (P+), where the seventh heavily doped region of the first conductivity type (P+) is electrically coupled with the third heavily doped region of the first conductivity type (P+) and the sixth heavily doped region of the second conductivity type (N+) in common.

In addition, FIG. 18 schematically shows a layout structural diagram of one another proposed transient voltage suppressor structure having multiple discharging paths in accordance with a ninth embodiment of the present invention, wherein FIG. 18 is one another modification from the FIG. 9 embodiment. As can be seen in the layout structural diagram of FIG. 18, based on a circuit diagram of the disclosed transient voltage suppressor structure having multiple discharging paths in FIG. 9, then the second doped well region 104' of the first conductivity type (P-type well2) and the seventh heavily doped region 27 of the first conductivity type (P+) can be further disposed as well, where the seventh heavily doped region 27 of the first conductivity type (P+) is electrically coupled with the third heavily doped region 23 of the first conductivity type (P+) and the sixth heavily doped region 26 of the second conductivity type (N+) in common. According to the ninth embodiment of the present invention in FIG. 18, further comprising the buried layer 901 of the second conductivity type (NBL), the deep doped well region 903 of the second conductivity type (DNW), the second doped well region 104' of the first conductivity type (P-type well2), and the seventh heavily doped region 27 of the first conductivity type (P+) being commonly connected with the third heavily doped region 23 of the first conductivity type (P+) and the sixth heavily doped region 26 of the second conductivity type (N+), multiple discharging paths can also be formed, thereby implementing the present invention.

Figure 19:
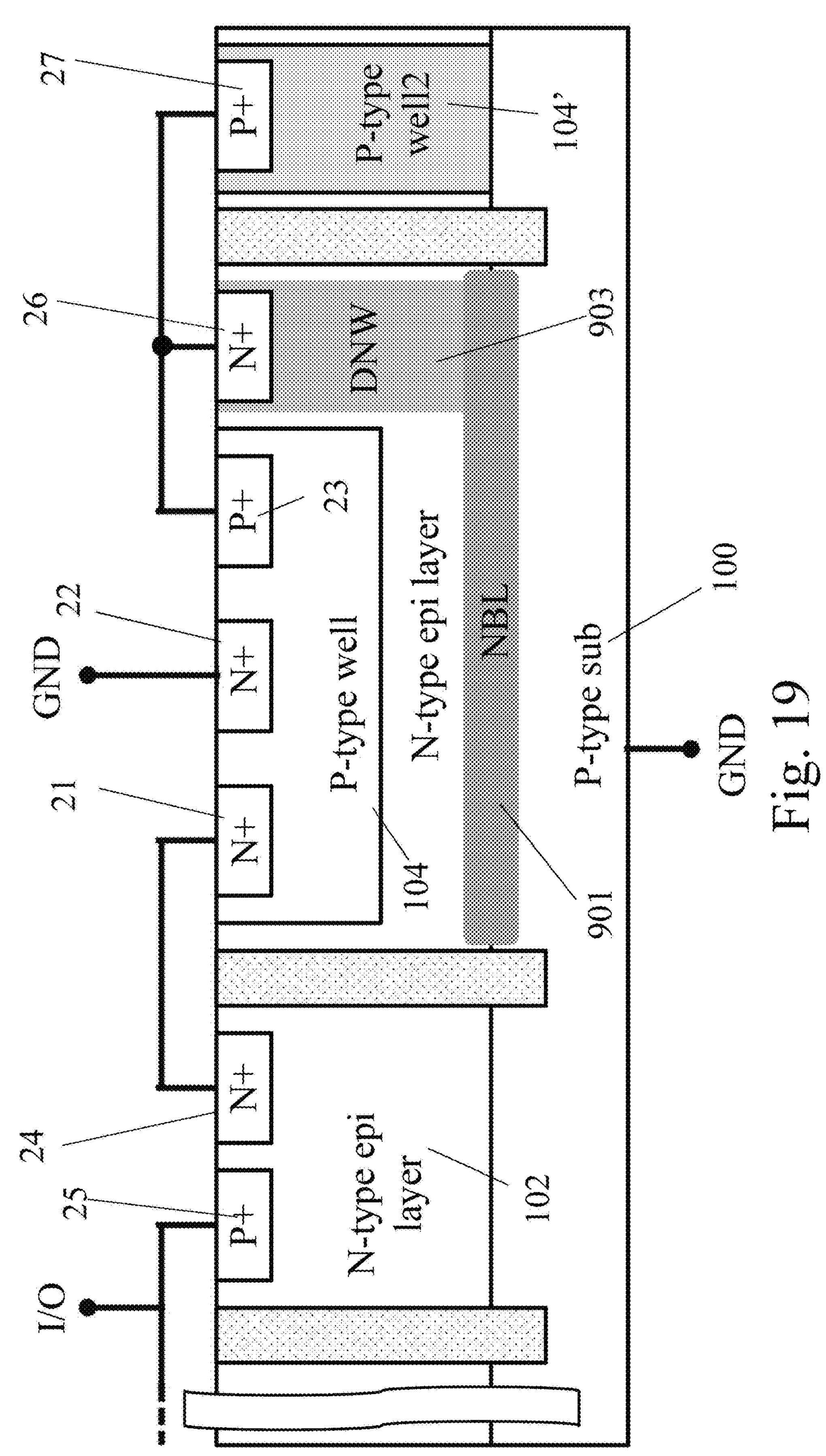
FIG. 19 schematically shows a layout structural diagram of another proposed transient voltage suppressor structure having multiple discharging paths in accordance with a tenth embodiment of the present invention, wherein the semiconductor substrate of the first conductivity type (P-type sub) in FIG. 18 can be further electrically connected to the ground terminal.

And furthermore, FIG. 19 schematically shows a layout structural diagram of one another proposed transient voltage suppressor structure having multiple discharging paths in accordance with a tenth embodiment of the present invention, wherein FIG. 19 is a modification from the FIG. 18 embodiment. As can be seen in the layout structural diagram of FIG. 19, based on a circuit diagram of the disclosed transient voltage suppressor structure having multiple discharging paths in FIG. 18, then the semiconductor substrate 100 of the first conductivity type (P-type sub) may also be further electrically connected to the first pin, which is the ground terminal GND, as well. As such, it is believed that another variant embodiment as disclosed in the tenth embodiment illustrated in FIG. 19, comprising the buried layer 901 of the second conductivity type (NBL), the deep doped well region 903 of the second conductivity type (DNW), the second doped well region 104' of the first conductivity type (P-type well2), the seventh heavily doped region 27 of the first conductivity type (P+) commonly connected with the third heavily doped region 23 of the first conductivity type (P+) and the sixth heavily doped region 26 of the second conductivity type (N+), and the semiconductor substrate 100 of the first conductivity type (P-type sub) further coupled to the ground terminal GND, may also be adopted for implementing the present invention.

And regarding the technical solution of the present invention, as previously described in the earlier paragraphs, according to the present invention, the first conductivity type and the second conductivity type of the present invention are certainly not limited by the above-mentioned embodiments. In other words, according to alternative embodiments of the present invention, the first conductivity type may also be selected as an N-type conductivity type, and the second conductivity type may be illustrative as a P-type conductivity type as well, and the alternative variations and embodiments may also be made by people who are skilled in the art and having ordinary skills of the art. In general, the present invention covers the modifications and its equality based on the disclosed technical contents of the present invention regardless of the conductivity types. And such embodiments are still applicable to implement the objectives of the present invention for providing a transient voltage suppressor structure having multiple discharging paths.

As a result, to sum up, according to the technical contents of the present invention, the Applicants of the present invention provide a plurality of feasible embodiments in the above-mentioned paragraphs for implementing the inventive effect of the invention for your references. It is apparent that, compared to the conventional prior arts, the present invention is characterized by providing a transient voltage suppressor structure which is able to form a plurality of multiple discharging paths when a transient event takes place. As can be seen from the plurality of embodiments, it is obvious that the technical spirits of the present invention lie in electrically connecting the sixth heavily doped region of the second conductivity type (N+) with the third heavily doped region of the first conductivity type (P+), such that the epitaxial layer of the second conductivity type (N-type epi layer) and the doped well region of the first conductivity type (P-type well) are electrically connected. By such configurations, a few more conducting paths can be thus formed under a surged operation mode, so as to increase the electrostatic discharge (ESD) protection efficiency of the transient voltage suppressor structure. Moreover, since the epitaxial layer of the second conductivity type (N-type epi layer) and the doped well region of the first conductivity type (P-type well) have the same voltage level, the present invention also achieves in suppressing the formation of stray electrical currents, and further in reducing I/O-to-GND leakage current levels. And furthermore, according to a variety of modifications of the present invention, a buried layer, a deep well region, another P-type well region for accommodating a P-type heavily doped region, and/or a P-type substrate further in electrical connection with ground, may be alternatively adopted based on different layout requirements determined by people skilled in the technical backgrounds. As a result, it is evident that the Applicants of the present invention have disclosed a plurality of applicable embodiments, which are advantageous of having extraordinary layout flexibility and can be composed of a variety of layout designs. Accordingly, in view of the technical contents and manners disclosed in the present invention without departing from the spirits of the present invention, it is believed that those skilled in the art and having general knowledge are able to make appropriate modifications or variations based on necessary circuit layout requirements, and the present invention is not restricted by the certain limited configurations and/or circuit diagrams as disclosed in the embodiments of the present invention. As a result, either the modifications or the variations should still fall into the scope of the present invention, and the present invention covers the modifications and its equality.

More specifically, according to the technical characteristics of the present invention which have been provided by the Applicants as illustrated in the previous paragraphs, it is obvious that the disclosed transient voltage suppressor structure with a plurality of multiple discharging paths is effective. As can be seen from the embodiments, the present invention is aimed to propose and provide a great number of merits and advantages which can be accomplished by adopting the present invention. Therefore, in view of all, it is obvious that the present invention is not only novel and inventive but also believed to be advantageous of solving and avoiding the conventional issues existing in the prior arts.

As a result, when compared to the prior arts, it is ensured that the present invention apparently shows much more effective performances than before. In addition, it is believed that the present invention is instinct, effective and highly competitive for IC technology and industries in the market nowadays, whereby having extraordinary availability and competitiveness for future industrial developments and being in condition for early allowance.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A transient voltage suppressor structure having multiple discharging paths, comprising:

a semiconductor substrate of a first conductivity type;

an epitaxial layer of a second conductivity type, which is formed on the semiconductor substrate of the first conductivity type, wherein the second conductivity type is opposite to the first conductivity type;

a doped well region of the first conductivity type, which is formed in the epitaxial layer of the second conductivity type, wherein a first heavily doped region of the second conductivity type, a second heavily doped region of the second conductivity type, and a third heavily doped region of the first conductivity type are further disposed in the doped well region of the first conductivity type; and wherein the second heavily doped region of the second conductivity type is electrically connected to a first pin, the first heavily doped region of the second conductivity type is electrically connected to a fourth heavily doped region of the second conductivity type, and the fourth heavily doped region of the second conductivity type and a fifth heavily doped region of the first conductivity type are commonly disposed in the epitaxial layer of the second conductivity type, where the fifth heavily doped region of the first conductivity type is electrically connected to a second pin; and wherein a sixth heavily doped region of the second conductivity type is further disposed in the epitaxial layer of the second conductivity type and the sixth heavily doped region of the second conductivity type in the epitaxial layer of the second conductivity type is electrically connected in common with the third heavily doped region of the first conductivity type in the doped well region of the first conductivity type; and a plurality of isolation trench, being disposed adjacent to the fifth heavily doped region of the first conductivity type, adjacent to the sixth heavily doped region of the second conductivity type and between the first heavily doped region of the second conductivity type and the fourth heavily doped region of the second conductivity type for electrical isolations, wherein a depth of each of the plurality of isolation trench is greater than a depth of the epitaxial layer of the second conductivity type.

2. The transient voltage suppressor structure having multiple discharging paths according to claim 1, wherein when the first conductivity type is a P-type conductivity type and the second conductivity type is an N-type conductivity type, the first pin and the second pin are electrically coupled to a ground terminal and to an input and output (I/O) terminal, respectively.

3. The transient voltage suppressor structure having multiple discharging paths according to claim 2, wherein when the first pin and the second pin are electrically coupled to the ground terminal and to the input and output (I/O) terminal, respectively, a positive surged operating mode is applied, and the transient voltage suppressor structure having multiple discharging paths is formed, comprising a first lateral diode conducting path and a lateral n-p-n bipolar junction transistor conducting path, wherein the first lateral diode conducting path is constructed from the input and output (I/O) terminal, the fifth heavily doped region of the first conductivity type, the epitaxial layer of the second conductivity type to the fourth heavily doped region of the second conductivity type, and the lateral n-p-n bipolar junction transistor conducting path is constructed from the first heavily doped region of the second conductivity type, the doped well region of the first conductivity type, the second heavily doped region of the second conductivity type to the ground terminal.

4. The transient voltage suppressor structure having multiple discharging paths according to claim 3, further comprising a vertical p-n-p bipolar junction transistor conducting path, a vertical diode conducting path and a second lateral diode conducting path, wherein the vertical p-n-p bipolar junction transistor conducting path is constructed from the input and output (I/O) terminal, the fifth heavily doped region of the first conductivity type, the epitaxial layer of the second conductivity type to the semiconductor substrate of the first conductivity type, the vertical diode conducting path is constructed from the semiconductor substrate of the first conductivity type, the epitaxial layer of the second conductivity type to the sixth heavily doped region of the second conductivity type, and the second lateral diode conducting path is constructed from the third heavily doped region of the first conductivity type, the doped well region of the first conductivity type, the second heavily doped region of the second conductivity type to the ground terminal.

5. The transient voltage suppressor structure having multiple discharging paths according to claim 3, wherein a power supply voltage (VDD) is injected to the input and output (I/O) terminal, and a voltage level of the power supply voltage is less than a first turn-on voltage for turning on the first lateral diode conducting path and the lateral n-p-n bipolar junction transistor conducting path.

6. The transient voltage suppressor structure having multiple discharging paths according to claim 4, wherein a power supply voltage (VDD) is injected to the input and output (I/O) terminal, and a voltage level of the power supply voltage is less than a second turn-on voltage for turning on the vertical p-n-p bipolar junction transistor conducting path, the vertical diode conducting path and the second lateral diode conducting path.

7. The transient voltage suppressor structure having multiple discharging paths according to claim 1, wherein the semiconductor substrate of the first conductivity type is further electrically connected to the first pin.

8. The transient voltage suppressor structure having multiple discharging paths according to claim 7, wherein when the first conductivity type is a P-type conductivity type and the second conductivity type is an N-type conductivity type, the first pin and the semiconductor substrate of the first conductivity type are electrically coupled to a ground terminal in common, and the second pin is electrically coupled to an input and output (I/O) terminal.

9. The transient voltage suppressor structure having multiple discharging paths according to claim 8, wherein when the first pin and the semiconductor substrate of the first conductivity type are electrically coupled to the ground terminal in common, and the second pin is electrically coupled to the input and output (I/O) terminal, a positive surged operating mode is applied, and the transient voltage suppressor structure having multiple discharging paths is formed, comprising a first lateral diode conducting path and a lateral n-p-n bipolar junction transistor conducting path, wherein the first lateral diode conducting path is constructed from the input and output (I/O) terminal, the fifth heavily doped region of the first conductivity type, the epitaxial layer of the second conductivity type to the fourth heavily doped region of the second conductivity type, and the lateral n-p-n bipolar junction transistor conducting path is constructed from the first heavily doped region of the second conductivity type, the doped well region of the first conductivity type, the second heavily doped region of the second conductivity type to the ground terminal.

10. The transient voltage suppressor structure having multiple discharging paths according to claim 9, further comprising a vertical p-n-p bipolar junction transistor conducting path, a vertical diode conducting path and a second lateral diode conducting path, wherein the vertical p-n-p bipolar junction transistor conducting path is constructed from the input and output (I/O) terminal, the fifth heavily doped region of the first conductivity type, the epitaxial layer of the second conductivity type to the semiconductor substrate of the first conductivity type, the vertical diode conducting path is constructed from the semiconductor substrate of the first conductivity type, the epitaxial layer of the second conductivity type to the sixth heavily doped region of the second conductivity type, and the second lateral diode conducting path is constructed from the third heavily doped region of the first conductivity type, the doped well region of the first conductivity type, the second heavily doped region of the second conductivity type to the ground terminal.

11. The transient voltage suppressor structure having multiple discharging paths according to claim 10, further comprising a vertically-grounding conducting path, wherein the vertically-grounding conducting path is constructed from the input and output (I/O) terminal, the fifth heavily doped region of the first conductivity type, the epitaxial layer of the second conductivity type, the semiconductor substrate of the first conductivity type to the ground terminal.

12. The transient voltage suppressor structure having multiple discharging paths according to claim 1, further comprising a buried layer of the second conductivity type and a deep doped well region of the second conductivity type, wherein the buried layer of the second conductivity type is disposed between the semiconductor substrate of the first conductivity type and the epitaxial layer of the second conductivity type, the deep doped well region of the second conductivity type is disposed in the epitaxial layer of the second conductivity type for accommodating the sixth heavily doped region of the second conductivity type, and wherein the deep doped well region of the second conductivity type is isolated from the doped well region of the first conductivity type and the deep doped well region of the second conductivity type is in connection with the buried layer of the second conductivity type, and wherein a depth of the deep doped well region of the second conductivity type is greater than a depth of the doped well region of the first conductivity type for contacting with the buried layer of the second conductivity type, and a doped concentration of the buried layer of the second conductivity type is greater than a doped concentration of the epitaxial layer of the second conductivity type for reducing an on-resistance of the transient voltage suppressor structure having multiple discharging paths.

13. The transient voltage suppressor structure having multiple discharging paths according to claim 12, wherein when the first conductivity type is a P-type conductivity type and the second conductivity type is an N-type conductivity type, the first pin and the second pin are electrically coupled to a ground terminal and to an input and output (I/O) terminal, respectively.

14. The transient voltage suppressor structure having multiple discharging paths according to claim 13, wherein when the first pin and the second pin are electrically coupled to the ground terminal and to the input and output (I/O) terminal, respectively, a positive surged operating mode is applied, and the transient voltage suppressor structure having multiple discharging paths is formed, comprising a first lateral diode conducting path and a lateral n-p-n bipolar junction transistor conducting path, wherein the first lateral diode conducting path is constructed from the input and output (I/O) terminal, the fifth heavily doped region of the first conductivity type, the epitaxial layer of the second conductivity type to the fourth heavily doped region of the second conductivity type and the lateral n-p-n bipolar junction transistor conducting path is constructed from the first heavily doped region of the second conductivity type, the doped well region of the first conductivity type, the second heavily doped region of the second conductivity type to the ground terminal.

15. The transient voltage suppressor structure having multiple discharging paths according to claim 14, further comprising a vertical p-n-p bipolar junction transistor conducting path, a vertical diode conducting path and a second lateral diode conducting path, wherein the vertical p-n-p bipolar junction transistor conducting path is constructed from the input and output (I/O) terminal, the fifth heavily doped region of the first conductivity type, the epitaxial layer of the second conductivity type to the semiconductor substrate of the first conductivity type, the vertical diode conducting path is constructed from the semiconductor substrate of the first conductivity type, the buried layer of the second conductivity type, the deep doped well region of the second conductivity type to the sixth heavily doped region of the second conductivity type, and the second lateral diode conducting path is constructed from the third heavily doped region of the first conductivity type, the doped well region of the first conductivity type, the second heavily doped region of the second conductivity type to the ground terminal.

16. The transient voltage suppressor structure having multiple discharging paths according to claim 1, further comprising a second doped well region of the first conductivity type and a seventh heavily doped region of the first conductivity type, wherein the second doped well region of the first conductivity type is disposed in the epitaxial layer of the second conductivity type for accommodating the seventh heavily doped region of the first conductivity type, the second doped well region of the first conductivity type and the seventh heavily doped region of the first conductivity type are disposed apart from the sixth heavily doped region of the second conductivity type by the isolation trench, and the seventh heavily doped region of the first conductivity type is electrically coupled with the third heavily doped region of the first conductivity type and the sixth heavily doped region of the second conductivity type in common.

17. The transient voltage suppressor structure having multiple discharging paths according to claim 16, wherein when the first conductivity type is a P-type conductivity type and the second conductivity type is an N-type conductivity type, the first pin and the second pin are electrically coupled to a ground terminal and to an input and output (I/O) terminal, respectively.

18. The transient voltage suppressor structure having multiple discharging paths according to claim 17, wherein when the first pin and the second pin are electrically coupled to the ground terminal and to the input and output (I/O) terminal, respectively, a positive surged operating mode is applied, and the transient voltage suppressor structure having multiple discharging paths is formed, comprising a first lateral diode conducting path and a lateral n-p-n bipolar junction transistor conducting path, wherein the first lateral diode conducting path is constructed from the input and output (I/O) terminal, the fifth heavily doped region of the first conductivity type, the epitaxial layer of the second conductivity type to the fourth heavily doped region of the second conductivity type and the lateral n-p-n bipolar junction transistor conducting path is constructed from the first heavily doped region of the second conductivity type, the doped well region of the first conductivity type, the second heavily doped region of the second conductivity type to the ground terminal.

19. The transient voltage suppressor structure having multiple discharging paths according to claim 18, further comprising a vertical p-n-p bipolar junction transistor conducting path, a vertical diode conducting path, a second lateral diode conducting path and a vertical pick-up conducting path, wherein the vertical p-n-p bipolar junction transistor conducting path is constructed from the input and output (I/O) terminal, the fifth heavily doped region of the first conductivity type, the epitaxial layer of the second conductivity type to the semiconductor substrate of the first conductivity type, the vertical diode conducting path is constructed from the semiconductor substrate of the first conductivity type, the epitaxial layer of the second conductivity type to the sixth heavily doped region of the second conductivity type, the second lateral diode conducting path is constructed from the third heavily doped region of the first conductivity type, the doped well region of the first conductivity type, the second heavily doped region of the second conductivity type to the ground terminal, and the vertical pick-up conducting path is constructed from the semiconductor substrate of the first conductivity type, the second doped well region of the first conductivity type to the seventh heavily doped region of the first conductivity type.

20. The transient voltage suppressor structure having multiple discharging paths according to claim 1, further comprising a second doped well region of the first conductivity type and a seventh heavily doped region of the first conductivity type, wherein the second doped well region of the first conductivity type is disposed in the epitaxial layer of the second conductivity type for accommodating the seventh heavily doped region of the first conductivity type, the second doped well region of the first conductivity type and the seventh heavily doped region of the first conductivity type are disposed apart from the sixth heavily doped region of the second conductivity type by the isolation trench, and the seventh heavily doped region of the first conductivity type is electrically coupled with the second heavily doped region of the second conductivity type and the first pin in common.

21. The transient voltage suppressor structure having multiple discharging paths according to claim 20, wherein when the first conductivity type is a P-type conductivity type and the second conductivity type is an N-type conductivity type, the first pin and the second pin are electrically coupled to a ground terminal and to an input and output (I/O) terminal, respectively.

22. The transient voltage suppressor structure having multiple discharging paths according to claim 21, wherein when the first pin and the second pin are electrically coupled to the ground terminal and to the input and output (I/O) terminal, respectively, a positive surged operating mode is applied, and the transient voltage suppressor structure having multiple discharging paths is formed, comprising a first lateral diode conducting path and a lateral n-p-n bipolar junction transistor conducting path, wherein the first lateral diode conducting path is constructed from the input and output (I/O) terminal, the fifth heavily doped region of the first conductivity type, the epitaxial layer of the second conductivity type to the fourth heavily doped region of the second conductivity type and the lateral n-p-n bipolar junction transistor conducting path is constructed from the first heavily doped region of the second conductivity type, the doped well region of the first conductivity type, the second heavily doped region of the second conductivity type to the ground terminal.

23. The transient voltage suppressor structure having multiple discharging paths according to claim 22, further comprising a vertical p-n-p bipolar junction transistor conducting path, a vertical diode conducting path, a second lateral diode conducting path and a vertical pick-up conducting path, wherein the vertical p-n-p bipolar junction transistor conducting path is constructed from the input and output (I/O) terminal, the fifth heavily doped region of the first conductivity type, the epitaxial layer of the second conductivity type to the semiconductor substrate of the first conductivity type, the vertical diode conducting path is constructed from the semiconductor substrate of the first conductivity type, the epitaxial layer of the second conductivity type to the sixth heavily doped region of the second conductivity type, the second lateral diode conducting path is constructed from the third heavily doped region of the first conductivity type, the doped well region of the first conductivity type, the second heavily doped region of the second conductivity type to the ground terminal, and the vertical pick-up conducting path is constructed from the semiconductor substrate of the first conductivity type, the second doped well region of the first conductivity type, the seventh heavily doped region of the first conductivity type to the ground terminal.

24. The transient voltage suppressor structure having multiple discharging paths according to claim 12, wherein the semiconductor substrate of the first conductivity type is further electrically connected to the first pin.

25. The transient voltage suppressor structure having multiple discharging paths according to claim 24, wherein when the first conductivity type is a P-type conductivity type and the second conductivity type is an N-type conductivity type, the first pin and the semiconductor substrate of the first conductivity type are electrically coupled to a ground terminal in common, and the second pin is electrically coupled to an input and output (I/O) terminal.

26. The transient voltage suppressor structure having multiple discharging paths according to claim 12, further comprising a second doped well region of the first conductivity type and a seventh heavily doped region of the first conductivity type, wherein the second doped well region of the first conductivity type is disposed in the epitaxial layer of the second conductivity type for accommodating the seventh heavily doped region of the first conductivity type, the second doped well region of the first conductivity type and the seventh heavily doped region of the first conductivity type are disposed apart from the sixth heavily doped region of the second conductivity type by the isolation trench, and the seventh heavily doped region of the first conductivity type is electrically coupled with the second heavily doped region of the second conductivity type and the first pin in common.

27. The transient voltage suppressor structure having multiple discharging paths according to claim 26, wherein the semiconductor substrate of the first conductivity type is further electrically connected to the first pin.

28. The transient voltage suppressor structure having multiple discharging paths according to claim 27, wherein when the first conductivity type is a P-type conductivity type and the second conductivity type is an N-type conductivity type, the first pin and the semiconductor substrate of the first conductivity type are electrically coupled to a ground terminal in common, and the second pin is electrically coupled to an input and output (I/O) terminal.

29. The transient voltage suppressor structure having multiple discharging paths according to claim 12, further comprising a second doped well region of the first conductivity type and a seventh heavily doped region of the first conductivity type, wherein the second doped well region of the first conductivity type is disposed in the epitaxial layer of the second conductivity type for accommodating the seventh heavily doped region of the first conductivity type, the second doped well region of the first conductivity type and the seventh heavily doped region of the first conductivity type are disposed apart from the sixth heavily doped region of the second conductivity type by the isolation trench, and the seventh heavily doped region of the first conductivity type is electrically coupled with the third heavily doped region of the first conductivity type and the sixth heavily doped region of the second conductivity type in common.

30. The transient voltage suppressor structure having multiple discharging paths according to claim 29, wherein the semiconductor substrate of the first conductivity type is further electrically connected to the first pin.

31. The transient voltage suppressor structure having multiple discharging paths according to claim 30, wherein when the first conductivity type is a P-type conductivity type and the second conductivity type is an N-type conductivity type, the first pin and the semiconductor substrate of the first conductivity type are electrically coupled to a ground terminal in common, and the second pin is electrically coupled to an input and output (I/O) terminal.

* * * * *